(12) United States Patent
Struckmeier et al.

(10) Patent No.: US 9,958,882 B2
(45) Date of Patent: May 1, 2018

(54) HEATING SYSTEM AND METHOD FOR HEATING A BUILDING AND/OR FOR PREPARING HOT WATER

(75) Inventors: Jens Struckmeier, Dresden (DE); Christof Fetzer, Dresden (DE)

(73) Assignee: Cloud & Heat Technologies GmbH (DE)

( * ) Notice: Subject to any disclaimer, the term of this patent is extended or adjusted under 35 U.S.C. 154(b) by 528 days.

(21) Appl. No.: 13/982,514

(22) PCT Filed: Feb. 1, 2012

(86) PCT No.: PCT/EP2012/051707
§ 371 (c)(1),
(2), (4) Date: Oct. 22, 2013

(87) PCT Pub. No.: WO2012/104354
PCT Pub. Date: Aug. 9, 2012

(65) Prior Publication Data
US 2014/0303787 A1    Oct. 9, 2014

(30) Foreign Application Priority Data

Feb. 1, 2011    (DE) .................. 10 2011 000 444

(51) Int. Cl.
*G05D 23/00*    (2006.01)
*G05D 23/19*    (2006.01)
(Continued)

(52) U.S. Cl.
CPC ............... *G05D 23/19* (2013.01); *F24D 3/08* (2013.01); *F24D 11/003* (2013.01);
(Continued)

(58) Field of Classification Search
CPC .... G05D 23/19; G06Q 50/06; F24D 19/1081; F24D 17/0047; F24D 11/003;
(Continued)

(56) References Cited

U.S. PATENT DOCUMENTS 6,223,101 B1    4/2001   Sakamoto et al.
6,896,612 B1 *  5/2005   Novotny ............ H05K 7/20618
                                                        361/691

(Continued)

FOREIGN PATENT DOCUMENTS

DE    102005021473    10/2006
EP    1319155         6/2003
(Continued)

OTHER PUBLICATIONS

Fontecchio, Mark, "Companies reuse data center waste heat to improve energy efficiency", Retrieved at <<http://searchdatacenter.techtarget.com/news/1314324/Companies-reuse-data-center-waste-heat-to-improve-energy-efficiency>>, May 20, 2008, pp. 5.*

(Continued)

*Primary Examiner* — Christopher E Everett
(74) *Attorney, Agent, or Firm* — Barnes & Thornburg LLP; Jeffrey R. Stone

(57) ABSTRACT

According to various embodiments, a heating system for heating a building and/or for preparing hot water is provided. The heating system can comprise a heat distributing device; and a computer, which is coupled to the heat distributing device in such a way that the heat produced by the computer is distributed in the building by means of the heat distributing device; wherein the computer is designed in such a way that the computer produces a message for a computing load distribution computer, wherein the message contains a piece of information about the heat demand of the heating system and/or of the building.

18 Claims, 20 Drawing Sheets

(51) Int. Cl.
| | |
|---|---|
| G06F 1/20 | (2006.01) |
| H05K 7/20 | (2006.01) |
| F24D 3/08 | (2006.01) |
| F24D 11/00 | (2006.01) |
| F24D 17/00 | (2006.01) |
| F24D 19/10 | (2006.01) |
| G06Q 50/06 | (2012.01) |

(52) U.S. Cl.
CPC ........ *F24D 11/005* (2013.01); *F24D 17/0047* (2013.01); *F24D 19/1081* (2013.01); *G06F 1/206* (2013.01); *G06Q 50/06* (2013.01); *H05K 7/20836* (2013.01); *F24D 2200/14* (2013.01); *F24D 2200/29* (2013.01); *F24D 2200/32* (2013.01); *Y02B 10/20* (2013.01); *Y02B 10/70* (2013.01); *Y02E 20/14* (2013.01)

(58) Field of Classification Search
CPC ...... F24D 11/005; F24D 3/08; F24D 2200/32; F24D 2200/14; F24D 2200/29; H05K 7/20836; G06F 1/206; Y02B 10/70; Y02B 10/20
See application file for complete search history.

(56) References Cited

U.S. PATENT DOCUMENTS

| | | | |
|---|---|---|---|
| 8,151,578 B1 * | 4/2012 | Morales ................ | F24F 3/0442 62/259.2 |
| 2003/0055969 A1 * | 3/2003 | Begun ................... | G06F 1/3203 709/226 |
| 2005/0108582 A1 * | 5/2005 | Fung ..................... | G06F 1/3203 713/300 |
| 2009/0218078 A1 | 9/2009 | Brunschwiler et al. | |
| 2009/0265568 A1 * | 10/2009 | Jackson ................ | G06F 1/3203 713/320 |
| 2010/0217454 A1 | 8/2010 | Spiers et al. | |
| 2011/0042059 A1 | 2/2011 | Jian | |
| 2012/0130554 A1 * | 5/2012 | Jain ........................ | G06F 1/329 700/291 |
| 2012/0158190 A1 | 6/2012 | Belady et al. | |

FOREIGN PATENT DOCUMENTS

| | | |
|---|---|---|
| JP | 11-023016 A | 1/1999 |
| JP | 11023016 | 1/1999 |
| KR | 1020050103855 A | 11/2006 |
| WO | 2010/019517 | 2/2010 |

OTHER PUBLICATIONS

Heger, Monca, "IBM tests heating homes with data-center waste heat", Retrieved at <<http://spectrum.ieee.org/computing/hardware/ibm-tests-heating-homes-with-datacenter-waste-heat >>, Nov. 20, 2008, p. 1.*

Heimbuch, Jaymi, "Data center housed under cathedral heats homes in Finland", Retrieved at <<http://www.treehugger.com/files/2009/12/data-center-housed-under-cathedral-heats-homes-in-finland.php >>,Dec. 1, 2009, pp. 2.*

Miller, Rich, "Data centers heat offices, greenhouses, pools", Retrieved at <<http://www.datacenterknowledge.com/archives/2010/02/03/data-centers-heat-offices-greenhouses-pools/ >>, Feb. 3, 2010, pp. 6.*

Tousi, Saleh, "Heat rises-re-using the heat generated by servers",Retrieved at << http://ezinearticles.com/?Heat-Rises---Re-Using-the-Heat-Generated-by-Servers&id=2372629 >>, May 20, 2009, pp. 6.*

Trowbridge, Dave, "Using waste heat from the data center", Retrieved at << http://newsroom.cisco.com/dlls/2010/hd-010410.html >>, Jan. 4, 2010, p. 1.*

Vela, Justin, "Helsinki data centre to heat homes", Retrieved at << http://www.guardian.co.uk/environment/2010/jul/20/helsinki-data-centre-heat-homes >>, Jul. 20, 2010, pp. 6.*

\* cited by examiner

HEATING SYSTEM AND METHOD FOR HEATING A BUILDING AND/OR FOR PREPARING HOT WATER

The invention relates to a heating system for heating a building and/or for preparing hot water, to a computer of a heating system for heating a building and/or for preparing hot water, and to a computing load distribution computer for distributing and coordinating computing tasks. In addition, the invention relates to a method for operating a heating system for heating a building and/or for preparing hot water, and to a method for operating a computing load distribution computer.

Nowadays, environmental protection and, in particular, sustainability are becoming evermore important. One aspect of this is what is referred to as "green computing"—the environmentally friendly and efficient use of information technologies which have become an indispensable part of our modern world. This approach is becoming increasingly important, not least because of the increasing use of large computing centers in industry and research. Despite the use of modern and efficient components, a very large amount of waste heat, which principally represents a wasted power, is produced by the computing industry in computing centers. If it is also considered that up to 50% of the energy is not used for the computing itself but rather for the necessary cooling, the immense potential of "green computing" for the environment becomes clear.

One possibility is to make available the waste heat produced by a large computer as useful heat in the building of the computer center. An example of this is the super computer Aquasar of IBM at the ETH Zurich, which has a water-based cooling circuit which outputs the absorbed portion of waste heat to a conventional building heating system of the ETH Zurich by means of a heat exchanger, and thereby assists the other energy sources in making available heat.

However, the energy consumption of buildings which, for example in the EU, is responsible for approximately 40% of the consumed energy, constitutes a much larger environmental burden than computing centers, the greater part of the energy here being used to produce heat in private households. Heating systems in buildings continue, for the most part, to be based on primary energy carriers (usually fossil fuels) and secondary energy carriers (electricity), assisted by regenerative energy carriers, for example solar power and wind power.

Patent DE 102005021473 B3 describes a collection of logic nodes which are connected to one another in a network and which can output thermal energy via an ohmic resistor, wherein the logic nodes can be used for processing information and also for directly heating gaseous, liquid or solid substances. In this context, the logic nodes are connected to a superordinate central system and can distribute computing work or process independently. In this context, the logic nodes output heat not only when processing a computing order but also when there is no computing order present.

Given the circumstances specified above, the object of the invention is to provide devices and methods which permit a building to be heated in a way which is novel, efficient and more environmentally friendly.

This object is achieved with the features according to the independent patent claims. Refinements can be found in the dependent patent claims.

The various embodiments clearly have in common the fact that the "green computing" approach is united, in a novel fashion, with the purpose of making buildings more efficient. Instead of adopting the previously customary method of conducting away the waste heat from a computing center in a complex and costly way using a long distance heating system, the approach adopted is to distribute heating systems based on computers among buildings and therefore to allow the heat, in the form of the waste heat of the computers, to be produced directly in the buildings and also used there. As a result, it is possible to dispense with the costly and complex long distance heating system and large-coverage provision of useful heat at buildings can be implemented. The computers may, and are designed or dimensioned to, determine the heating demand of the respective building and/or of the heating system into which they are integrated and to transmit said demand to the computing load distribution computer. The computing load distribution computer monitors and controls the computing load of each computer, in some cases as a function of the heating demand of the heating system and/or of the building, wherein the computing load of the computer is decisive for the amount of waste heat produced. The communication between the computing load distribution computer and a respective computer is carried out here over a network for example the Internet.

A heating system based on the main idea outlined above provides many advantages. As already mentioned, it allows, on the one hand, for "green computing" since the waste heat of a computer center can therefore be used particularly efficiently to heat buildings. In addition, environmental resources are spared since both the costly construction of a long distance heating system and the installation of the physical infrastructure for a computing center are dispensed with. Both aspects play a large role in the avoidance of $CO_2$ emissions. The generation of waste heat by computers of a distributed computing system in a building and/or a block of flats—that is to say directly at the customer's premises—is attractive, in particular, in the context of energy-efficient buildings and new buildings whose heating energy consumption is greatly reduced. Their energy requirement could be completely covered by the heating system presented here. Not least, the heating system which is explained in more detail below permits simplified installation in existing building architectures since for its operation it uses an available Internet connection as well as parts of a heating system which is already present in the building.

For example, as a rule a central system for the controlled residential ventilation functionality and integrated counterflow and crossflow heat exchangers are installed in low energy and passive residential units. In the case of a passive residential unit, the pre-heating of the fresh air which is sucked in from the external surroundings of the residential unit into its interior is usually implemented by means of a correspondingly dimensioned underground heat exchanger. The average air exchange rate is typically 0.5 per hour, related to the building volume. A typical value for a one-family house is 160 $m^3$ per hour.

In particular, various embodiments of a heating system for heating a building which has a heat distributing device and a computer (for example also referred to as a server) is therefore made available, said computer being coupled to the heat distributing device in such a way that the heat which is produced therefrom is distributed in the building by means of the heat distributing device. The computer is configured here in such a way that it produces a message for a computing load distribution computer, wherein the message contains information about a heating demand of the heating system and/or of the building.

For example, the heating system may be configured to prepare hot water. In addition, the computer can be configured in such a way that it may be switched on or off as a function of the computing load of the computer by powering said computer up or down. Powering down can be understood in various embodiments to mean switching off, as a result of which the computer can be placed in its currentless state, with the result that the computer does not consume any energy in the powered down state. During the powering down of the computer, all the volatile memories are, for example, deleted since they are no longer supplied with energy from the time when powering down occurs. In other words, a switched-off computer is not supplied with any energy at all anymore and no energy is consumed by a switched-off computer (in other words, the computer is clearly in a currentless state), in contrast to a computer which is in a standby state and then still unnecessarily consumes energy in such an operating state. Within the scope of powering down, for example the entire operating system of the computer is also deactivated in such a way that when it is reactivated (switched on), it is firstly necessary to carry out complete recharging and starting again. Correspondingly, in many embodiments powering up of the computer can be understood as meaning switching on from the powered down state, with the result that the computer is changed from a state which does not consume current into a state which does consume current. In various embodiments, the operating system of the computer is completely reloaded and started within the scope of the powering up.

With respect to the system described in patent DE 10 2005 021473 B3, an advantage of the heating system described here can be seen, for example, in the fact that idling phases in which the heat produced by the computer is too low for heating but the computer nevertheless consumes current can be avoided since the heating system can be operated as required as a function of the computing load of the computer and the computer can be powered down given deficiencies of the computing load. On the other hand, DE 10 2005 021473 B3 merely discloses a way of controlling the thermal energy output by the logic nodes by regulating the quantity of working instructions to be processed or by means of the quantity of information to be processed or by influencing the clock speed.

According to various embodiments of the heating system, the computer can be configured in such a way that the computer is switched on or off in reaction to the reception of a switch-on/switch-off message which is received by the computing load distribution computer. For this purpose, the switch-on/switch-off message may have, for example, a specific message field in which it can be explicitly specified whether the computer is to be switched on or off. For example, the specific message field may have a flag, that is to say a binary variable or a status indicator which may indicate whether the computer is to be switched on or off. For example, the binary value 0 can indicate that the computer is to be switched on, while the binary value 1 can indicate that the computer is to be switched on.

The heat distributing device may be, according to various embodiments, an apparatus which is configured to distribute in the building the heat which is made available by the heating system, for example the waste heat produced by the computer. For this purpose, the heat distributing device can have one or more pipes and/or one or more lines and/or one or more flow regulators and optionally one or more further fluidic devices which is/are filled with a fluid or by means of which heat produced by the computer is distributed in the building. Hot water may also be made available by the making available of heat by the heat distributing device. It is also possible to connect further appropriate elements to the heat distributing device or the heat distributing device may have said elements, for example at least one further energy supply (for example based on coal, heating oil, electricity, sunlight etc.), at least one apparatus for converting the energy supply into heat (for example a heating boiler) at least one apparatus for storing the heat (for example a heat accumulator) and at least one apparatus for transmitting the heat to spaces (for example heating element). The fluid, for example air, which cools the computer can be used as such directly by the heat distributing device, for example to control the temperature of spaces, or else also transmit its heat to another fluid, for example water, by means of a coupling via, for example, a heat exchanger, and then be distributed in the building by means of the heat distributing device. Furthermore, the thermal energy which is contained in the fluid and which cools the computer may be converted into another form of energy, for example into electricity by means of a turbine, and therefore be supplied to the heat distributing device. In other words, the computer may be coupled directly to the heat distributing device or coupled to the heat distributing device by means of a heat exchanger. The heating demand of the heating system and/or of the building may take into account here, for example, the heat which is both instantaneously necessary to supply the building with heat by means of the heat distributing device (for example warm water or air conditioning the spatial air) as well as the heat which is not output directly to the building but instead is buffered, for example, in the heat accumulator. In this context, the message produced by the computer can be tailored both to the instantaneous heating demand and/or to the heating demand predicted on the basis of predictions or a history of the provision of heat in the past. The building in which the heating system is installed can be any building, for example a one-family house, a multi-family house, a residential block, an office building, a commercially used building such as, for example, a supermarket, or a public facility such as, for example, a sports facility.

According to one embodiment of the heating system, the computer may have a transmitter which is configured in such a way that the message which is produced is transmitted to the computing load distribution computer. The transmitter can be a separate module or can be implemented by means of the computer. A connection of the computer to the external world, for example an Internet connection and/or a mobile radio connection, can be used to transmit the message, or a separate connection can be used.

In various embodiments the heating system can have a control device which is coupled to the computer or is implemented by means of the computer, wherein the control device is configured to control the heating system. The control device can also be optionally configured to carry out technical control functions in the power network and data network of the building.

According to various embodiments of the heating system, the control device can be configured to carry out control processes for acquiring at least one parameter which is necessary to operate the heating system. The parameter may be, for example, a quantity of heat which is supplied by the computer or which is necessary to heat the building, a temperature, for example of rooms or of the computer, an air humidity level, for example of rooms in the building or of the external surroundings and a time of day. In order to acquire the parameters, corresponding sensors such as, for example, a heat quantity sensor, a temperature sensor, an air humidity sensor, an electricity consumption sensor, a light sensor, a wind sensor, a carbon dioxide sensor, a fire alarm sensor, a water consumption sensor and/or a clock may be provided and can be mounted at corresponding locations inside and/or outside the building. The sensors can be controlled by the control device or operate independently. The communication between the sensors and the control unit can take place in a wireless or wire bound fashion. In addition, the above-mentioned sensors can be configured to produce estimated values for the parameters which are to be determined by them, for example, recorded values from the past and producing on the basis of these values estimated values, prediction values or interpolation values, by means of an estimation algorithm or prediction algorithm or interpolation algorithm. However, this functionality can also be implemented by means of the control device by the latter performing the storage and corresponding evaluation of measured values of the respective sensors. The control device can also be configured to obtain measurement data, for example via the Internet, with the result that, for example when a sensor fails it is possible to interrogate corresponding equivalent measured values, for example from weather measuring stations in the surroundings of the building.

According to various embodiments of the heating system, the system can also have a receiver which is configured to receive one or more messages from the computing load distribution computer, wherein the execution of calculations is requested in one or more of the messages. The receiver can be a separate module or can be implemented by means of the computer. In order to receive the message, a connection of the computer to the external world, for example an Internet connection and/or a mobile radio connection, can be used. The computer can also be configured in such a way that it carries out the calculations requested by means of the one or more received messages. The requested calculations or else parts thereof can be carried out immediately or at a later point. Executions at a later point may be linked, for example, to specific conditions such as a drop in the price of electricity below a predetermined price threshold. Further conditions may be, for example, linked to specific parameter values which are made available by the sensors, for example the fact that a specific external temperature is reached or a specific duration of sunshine is undershot. The received messages may contain any parameters and/or data which are provided or desired for carrying out the calculations, for example program instructions, data records, scripts. Calculations which a computer carries out are to be understood here as meaning all the processes which a computer has to execute in order to calculate data and/or store it and/or process it and/or process it in some other way, for example execute scripts and/or programs such as encryption, compression, compilation tasks and/or make available complete virtual machines and/or make available storage services and/or archiving services on storage media.

In various embodiments the heating system can have a heat exchanger which is coupled to the heat distributing device by means of the computer. In addition, the heating system can have an air supply device which is coupled to the computer by means of the heat exchanger in such a way that supplied air serves to cool the computer. By arranging a heat exchanger between the air supply device and the computer, the supplied air can, when necessary, for example when there is a cool external temperature, be preheated by the air which is to be discharged from the building.

According to a further embodiment of the heating system, the air supply device can also have a bypass which makes available a coupling to the computer by passing the heat exchanger. As a result it is possible to direct air made available by the air supply device for cooling the computer, without detours with respect to the computer, and therefore to ensure the lowest possible level of preheating, which is particularly advantageous for the warm time of year.

According to a further embodiment of the heating system, the computer can have a bypass which makes available a coupling of the heat distributing device to the heat exchanger by bypassing the computer. This makes it possible for air which is discharged from the building and which has output its heat as heating power to rooms to be directed into the heat exchanger by bypassing the computer and to be subsequently discharged from the building.

In various embodiments of the heating system, there may be a structure which is coupled to the computer and which makes available a direct coupling of the computer to the external world for cooling the computer. By means of such a structure it is possible to discharge waste heat of the computer by means of the air made available for cooling and to direct said air directly to the external world. The structure is therefore advantageous for cases in which, for example, the computer produces too much waste heat and/or the heating demand of the heating system and/or of the building is covered.

According to one further embodiment, the heating system has a heat accumulator, for example a buffer accumulator, a stratified storage device and/or a swimming bath. The heat accumulator can also be made available by means of a concrete core temperature control system. By providing a heat accumulator it is possible to use a fluid in the heat accumulator to store the waste heat produced by the computer and then to output the heat, for example with a time offset, to the building or to a hot water supply system of the building.

In addition, in various embodiments a computer of a heating system for heating a building and/or for preparing hot water is made available, wherein the computer is configured in such a way that it produces a message for a computing load distribution computer, wherein the message contains information about a heating demand of the heating system and/or of the building. In one refinement it is possible to provide that the computer is also configured in such a way that it can be switched on or off as a function of the computing load of the computer by being powered up or powered down. The information about the heating demand can have, for example, measured and/or predicted parameter values of the sensors enumerated above and/or an estimated heating demand level, for example on the basis of a weather forecast.

According to further embodiments, the computer can be configured in such a way that the computer is switched on or off in reaction to the reception of a switch-on/switch-off message which is received by a computing load distribution computer. For example, an excessively low computing load, for example an absence of working load at the computer can lead to a situation in which it is switched off.

According to a further advantageous embodiment of the computer, the latter has at least one connection for making available cooling air and at least one further connection for discharging cooling air. The one connection can be provided to connect the computer, for example, to the heat exchanger, with the result that the possibility is provided of, for example, preheating cooling air before it enters the computer. The further connection can be provided for connecting the computer to, for example, a heat distributing device of the building, with the result that the heated cooling air which leaves the computer can output its heat to the heat distributing device.

In various embodiments, the computer can be configured in such a way that it carries out the calculations requested by means of the one or more received messages. However, the task field of the computer is not restricted to this. It is, therefore, possible, for example, for calculations other than those requested to be carried out on the computer, for example calculations necessary for the operation of the heating system or which are requested by persons present in the building, via terminals which are connected to the computer.

In various embodiments, the computer can have one or more computing nodes, preferably a maximum 30 computing nodes, and more preferably a maximum 10 computing nodes. Each of the computing nodes can here be a main board with at least one processor with, in each case, at least one core. At least one storage medium, for example in the form of a hard disk or an SSD (solid state drive), and at least one network card or network adapter, can be connected to the main board. The design of the computer is typically based on a server rack (server module carrier) into which the computing nodes are plugged in the form of a plug-in circuit board, wherein said rack is adapted in accordance with the taking in and outputting of cooling air. The computing nodes can be coupled to one another by means of a switch point, for example a switch or router.

According to a further embodiment, the computer is the only heating element coupled to the heating distributing device of the building. In such a case, the heating demand can be covered completely by the waste heat of the computer, which constitutes a particularly environmentally friendly and enduring way for heating a building.

According to various embodiments, in respect of the heating system a method is made available for operating a heating system for heating a building and/or for preparing hot water, wherein the method includes determining a heating demand of the heating system and/or of the building and/or of the water; producing a message for a computing load distribution computer with information about the heating demand of the heating system and/or of the building by means of a computer. In one refinement, the method may also include switching on or off the computer as a function of the computing load of the computer by powering the computer up or down. The switching on and/or switching off can be conditioned or influenced by further factors, for example by a supply of regeneratively produced electricity, the price paid for electricity or possible heating capacities of the heating system and/or of the building and/or of the water or existing cooling capacities are taken into account in the control of the switching on or switching off of the respective computer.

According to further embodiments of the method for operating the heating system, the switching on or switching off of the computer can take place in reaction to the reception of a switch-on/switch-off message which is received by a computing load distribution computer.

In a further refinement of the method, said method includes transmitting the produced message to the computing load distribution computer. The transmission can be carried out here by the transmitter mentioned above in relation to the heating system and the computer or else by the control device.

According to a further embodiment of the method, at least one parameter which is necessary for operating the heating system can be acquired. The acquisition can take place, for example, by means of the control device which is mentioned above in relation to the heating system.

According to yet another embodiment, the method can also include one or more messages being received from the computing load distribution computer, wherein the execution of calculations is requested in the one or more messages.

In yet a further embodiment, the method may include the calculations requested by means of the one or more received messages being carried out by means of the computer.

According to various embodiments, the method may also include the computer transmitting the waste heat produced by the computer during the execution of the requested calculations, and transmitting said waste heat to a heat distributing device of the heating system.

According to a further embodiment, during the method results of the requested calculations carried out by the computer are made available to the computing load distribution computer. The results can be transferred here in the same way as the produced message to the computing load distribution computer or to any other computer. The transfer can take place, for example, by means of the above mentioned transmitter or else by means of the computer itself.

According to yet further embodiments of the method, the requested calculations can be carried out in such a way that the waste heat which is produced in the process covers the heating demand. It is to be understood by this that the computer which carries out the calculations has to have a greater or lesser computing load as a function of the heating demand, since the amount of computing load, that is to say the number of working processes running on the computer, directly influences the quantity of waste heat produced.

In a further refinement of the method, the computer produces a message and transmits it to the computing load distribution computer with information about an operating state of the computer.

According to yet another refinement of the method, the operating state of the computer is adapted by stopping and/or adding and/or removing computing tasks.

According to one aspect of the method, the operating state of the computer can also be adapted by placing individual computing nodes in an energy saving mode. The energy saving mode can have a plurality of different gradations here. It is therefore possible, for example, for at least one processor to be switched into a lower power mode in which said processor takes up less power. However, it is also possible to switch off at least one processor entirely. Moreover, at least one computing node can be placed in a sleep mode or standby mode or a currentless state (hibernation). This advantageously makes available a possible way of adjusting the computer, in terms of power, to the requested computing tasks and in this way operating it in a very energy-efficient fashion.

According to a further embodiment, the method may include determining whether the calculated or predicted heating demand can be covered by a heat accumulator; making available heat from the heat accumulator for covering the heating demand if heat stored in the heat accumulator is sufficient to cover the heating demand or, otherwise, producing the message for the computing load distribution computer with the information about the heating demand of the heating system and/or of the building. In this embodiment, for example the heating demand of the heating system and/or of the building is firstly covered by means of the heat contained in the heat accumulator. It is to be noted that when the accumulator is not completely loaded it can also be used if computing power is acquired, without there being heating demand.

According to a further embodiment, the method may include the computer transmitting the waste heat produced by the computer during the execution of the requested calculations to a heat distributing device of the heating system, wherein a portion of the waste heat which is transmitted to the heat distributing device is stored in the heat accumulator. This embodiment makes it possible simultaneously to load the heat accumulator and to transmit heat to the heat distributing device of the heating system. The latter can preferably occur when the waste heat of the computer exceeds the current heating demand and the heat accumulator, which functions, as it were, as a buffer, has free storage capacity.

In the text which follows, in various embodiments a computing load distribution computer for distributing and coordinating computing tasks is also made available, said computing load distribution computer having a receiver which is configured in such a way that it receives at least one message from at least one computer, wherein the at least one message contains information about a heating demand of a heating system and/or of a building and/or of hot water to be prepared, and a transmitter which is configured to transmit a switch-on/switch-off message to the at least one computer, wherein the switch-on/switch-off message specifies whether the at least one computer is to be switched on or off by powering the computer up or down. The receiver and/or the transmitter may be a separate module or may be implemented by means of the computer. A connection of the computing load distribution computer to the external world, for example an Internet connection and/or a mobile radio connection, can be used to receive and/or transmit the at least one message.

According to a further embodiment of the computing load distribution computer, the latter can have a switch-on/switch-off message-producing unit which is coupled to the transmitter and which is configured to produce the switch-on/switch-off message. The switch-on/switch-off message-producing unit can be configured to produce the switch-on/switch-off message, for example, as a function of the computing load of the computer and on the basis of the heating demand of the heating system and/or of the building and/or of the water which is signaled by means of the message of the computer. However, other factors for producing the switch-on/switch-off message can also be taken into account, for example the supply of regeneratively produced electricity, the price paid for electricity or possible heating capacities of the heating system and/or of the building and/or the water or cooling capacities which are present.

According to a further embodiment, the computing load distribution computer can be embodied as a single computer or can have a plurality of computers. In other words, the computing load distribution computer can have a plurality of computers on which a computing distribution algorithm is implemented, and the totality of these computers forms a decentralized computing load distribution computer.

According to a further embodiment, the computing load distribution computer can have a plurality of computers, wherein at least a portion of the computing load distribution computer forms a peer-to-peer network.

According to yet a further embodiment, the computing load distribution computer can be configured to produce at least one message to the at least one computer, wherein calculations are requested by means of the messages, wherein the requested calculations are determined by using the heating demand, received by the respective computer, of the heating system and/or of the building in which the computer is arranged. The at least one message which is produced by the computing load distribution computer can contain any parameters and/or data which are provided for carrying out the calculations, for example program instructions, data records, scripts. These and further types of data can be contained in a message here or can be grouped as desired and contained in a plurality of messages.

In another aspect, the computing load distribution computer can be configured in such a way that the requested calculations are determined as a function of, for example, the heating demand of the heating system and/or of the building and/or of a priority of the calculations and/or of a free computing capacity of the computer and/or an availability level of a necessary piece of infrastructure and/or a price paid for electricity and/or a supply level of regeneratively produced current and/or a state of charge and/or an availability level of a heat accumulator of the heating system and/or of the building. Each of the parameters just mentioned by way of example may be a real time value which is determined as required, or else be a value which is updated in specific (predefined) time intervals and therefore constitutes a parameter value from the past. In addition, each of the parameters just mentioned by way of example may be an estimated value or predicted value or an interpolation value which is determined on the basis of corresponding parameters from the past.

According to a further aspect, the computing load distribution computer can have a transmitter which is configured in such a way that it transmits at least one message to at least one computer, wherein calculations are requested by means of the messages.

According to yet a further aspect, the computing load distribution computer can be configured to transmit data to the computers on the basis of which the calculations are carried out. The data can be transmitted, for example, by means of the transmitter and can contain any data which is also necessary to carry out the calculations, for example programs or parts thereof, program instructions, data records, scripts.

In respect of the computing load distribution computer, according to various embodiments a method for operating a computing load distribution computer is made available, wherein the method receiving at least one message from at least one computer, wherein the at least one message contains information about a heating demand of a heating system and/or of a building and/or of a hot water preparation system. In one refinement, the method may also include switching the computer on or off as a function of the computing load of the computer by powering the computer up or down.

According to one embodiment, the method may also include: receiving a switch-on/switch-off message, wherein the switch-on/switch-off message specifies whether the at least one computer is to be switched on or off by powering the computer up or down; and switching on or off the computer as a function of the received switch-on/switch-off message. For this purpose, the switch-on/switch-off message can have, for example, a specific message field in which it can be explicitly specified whether the computer is to be switched on or off. For example, the specific message field can have a flag, that is to say a binary variable or a status indicator which can indicate whether the computer is to be switched on or off. For example, the binary value 0 can indicate that the computer is to be switched on, while the binary value 1 can indicate that the computer is to be switched on.

According to one embodiment, the method includes generating at least one message to the at least one computer, wherein calculations are requested by means of the messages, wherein the requested calculations are determined using the heating demand, received by the respective computer, of the heating system and/or of the building in which the computer is arranged.

In addition, in the method the requested calculations can be determined as a function of the heating demand of the heating system and/or of the building and/or a priority level of the computing load data and/or a free computing capacity of the computer and/or an availability level of a necessary piece of infrastructure and/or a price paid for electricity and/or a supply of regeneratively produced current and/or a state of charge and/or an availability level of a heat accumulator and/or a heat discharge capacity. Heat discharge capacity is to be understood as meaning here, for example, the quantity of waste heat which can be discharged by the computer. The heat discharge capacity can be reduced, for example, in the case of high external temperatures if at the same time the heating demand of the building turns out to be low, and it can be increased in the case of low external temperatures if at the same time the heating demand of the building turns out to be low.

According to a further embodiment, the method can include transmitting at least one message to at least one computer, wherein calculations are requested by means of the message.

Embodiments of the invention are illustrated in the figures and will be explained in more detail below.

In the following detailed description, reference is made to the appended drawings which form part thereof and in which specific embodiments in which the invention can be applied are shown for the sake of illustration. In this respect, directional terminology such as, for example, "at the top", "at the bottom", "at the front", "at the rear", "front", "rear" etc. is used with respect to the orientation of the described figure/figures. Since components having embodiments can be positioned with a number of different orientations, the directional terminology serves for the purpose of illustration and is not restrictive in any way. Of course, other embodiments can be used and structural or logic changes made without deviating from the scope of protection of the present invention. Of course, the features of the various embodiments described herein can be combined with one another unless specifically specified otherwise. The following detailed description is therefore not to be considered as restrictive and the scope of protection of the present invention is defined by the appended claims.

Within the scope of this description, the terms "connected", and "coupled" are used to describe either a direct or indirect connection and a direct or indirect coupling. In the figures, identical or similar elements are provided with identical reference symbols insofar as this is expedient.

Figure 1:
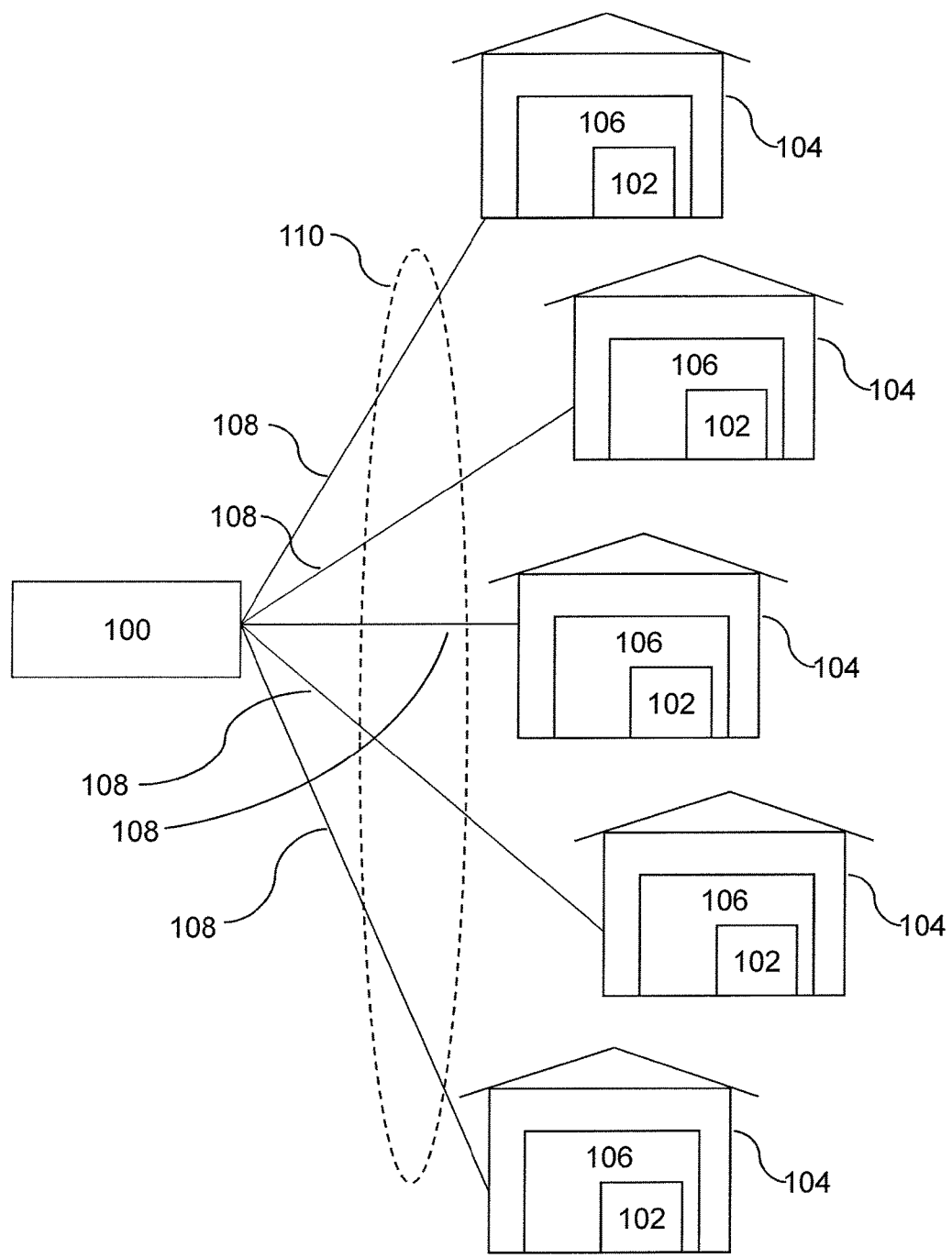
FIG. 1 shows a heating system network which is coupled to a central computing load distribution computer by means of the Internet, according to various embodiments.

FIG. 1 shows a design of a heating system network according to various embodiments. The heating system network has a central computing load distribution computer 100 which is connected by means of connections 108 to a multiplicity of heating systems 106 which are integrated in buildings 104, wherein the individual connections 108 are to be considered as being representative of paths in a network, in this example the Internet 110. The connections 108 can be configured as wire-bound and/or wireless connections. Wire-bound connections 108 may be, for example, conventional telephone lines which are capable of making available an Internet connection via Modem, ISDN (Integrated Services Digital Network) and/or DSL (Digital Subscriber Line) and/or glass fiber cables and/or television cables (in which case a cable modem can then be used for inputting and extracting information) Connections 108 which are configured in a wireless fashion may be made available, for example, by means of a WLAN network (Wireless Local Area Network) and/or by means of a mobile radio network which is based, for example, on the UMTS mobile radio standard (Universal Mobile Telecommunications System) or which brings about the entire communication or parts of the communication via satellite. The connections 108 in FIG. 2 can be combined here in any desired way. Every heating system 106 has, inter alia, a computer 102 which outputs its waste heat to the heating system 106. The computers 102 and the computing load distribution computer 100 are connected here to one another via, for example, a peer-to-peer network and/or via a VPN network (Virtual Private Network) to form a computer cloud (cloud computing) and therefore make available cloud computing infrastructure. The central computing load distribution computer (for example also referred to as a computing load distribution server) 100 coordinates the distribution of computing tasks to the computers 106 here. In general terms, the heating system network can have a group of computers which make available computing power and heating power in a cloud grouping. In this context, the computing load distribution computer acts as a controlling and supervision entity which can control the computers as a function of relevant parameters such as, for example, computing requirements and heating demand, which will be described later in more detail.

Figure 2:
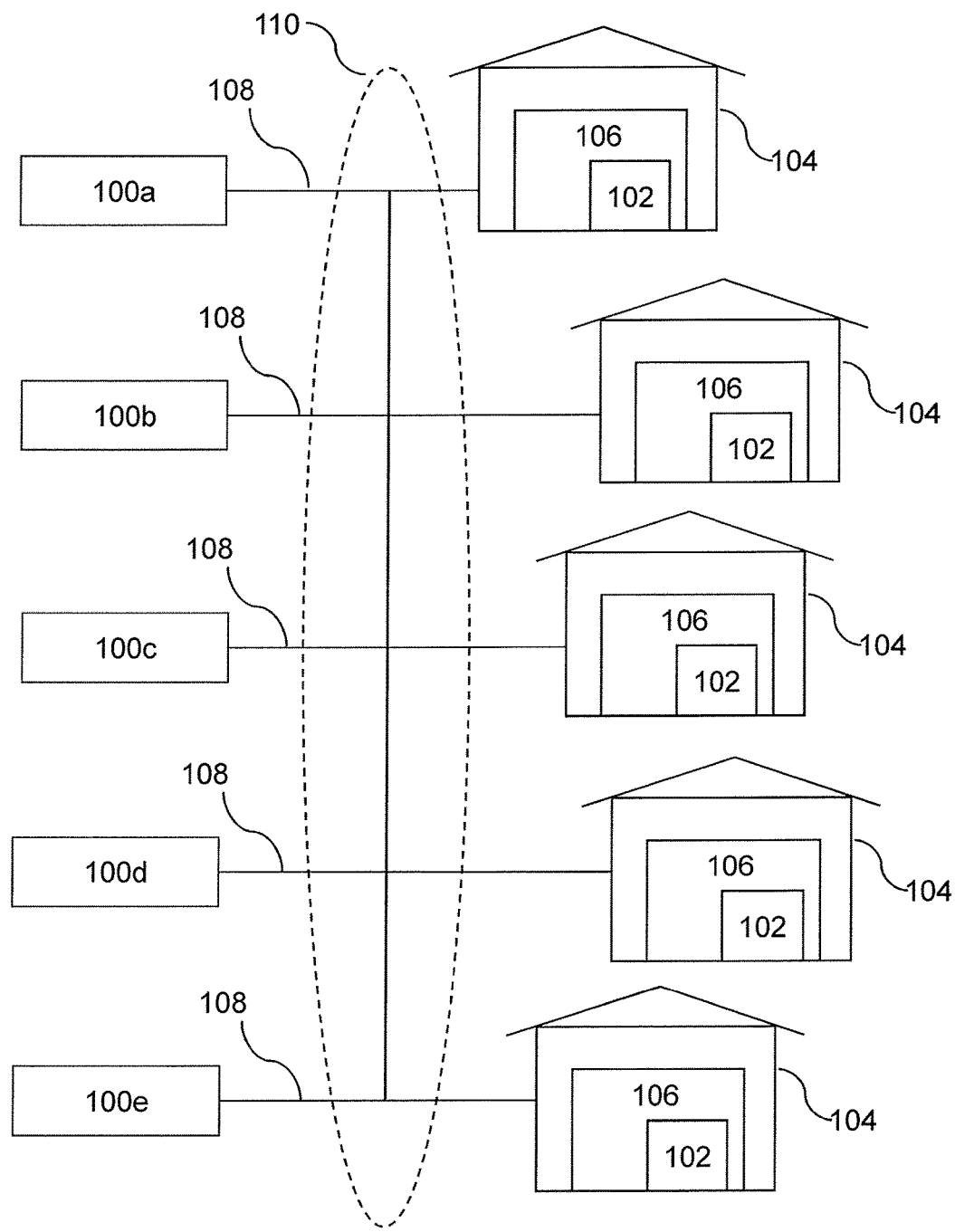
FIG. 2 shows a heating system network which is coupled to a decentralized computing load distribution computer by means of the Internet, according to various embodiments.

FIG. 2 illustrates a design of a heating system network according to various embodiments. However, in contrast to the heating system network illustrated in FIG. 1, the computing load distribution computer 100 according to this embodiment is embodied in a decentralized fashion i.e. the computing load distribution computer 100 has a plurality of computing units 100a to 100e and is implemented on a plurality of computer units 100a to 100e which can be divided, for example, into various regions. Here, computers 102 of the heating systems 106 and the totality of the computing load distribution computers 100 are connected to one another via a peer-to-peer network, for example by means of the Internet 110, to form a computer cloud, and the computer units 100a to 100e coordinate the distribution of computing tasks to the computers 102. The computer units 100a to 100e can therefore communicate with one another and with the computers 102 by means of the connections 108. A cloud computing infrastructure is made available by means of the totality of the computer units 100a to 100e, the computers 102 and the connections 108.

Figure 3:
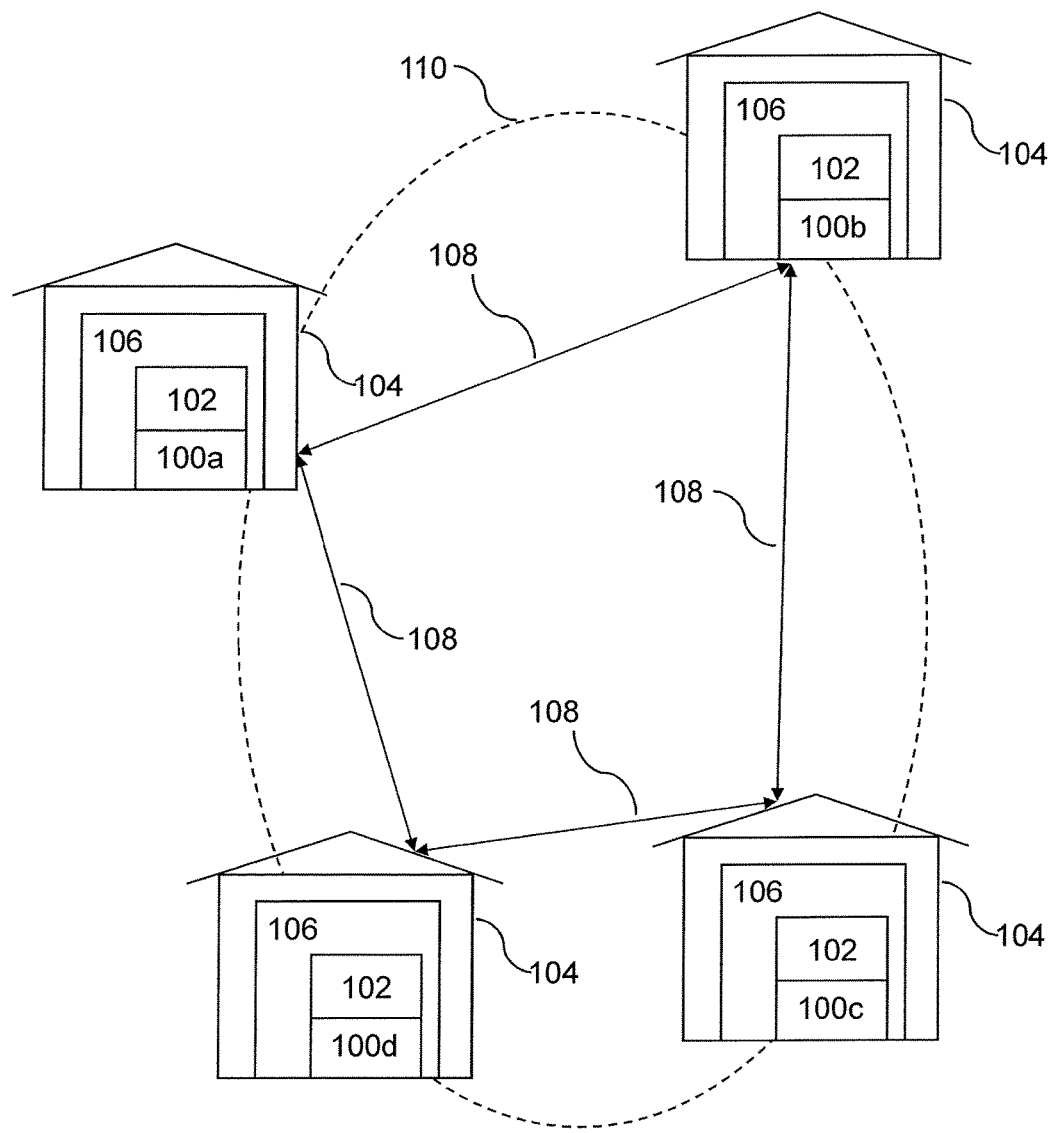
FIG. 3 shows a heating system network which is coupled to a decentralized computing load distribution computer which is distributed over the heating systems, according to various embodiments.

FIG. 3 illustrates a further example of a design of a heating system network which is based on the design illustrated in FIG. 2. Here, the computing load distribution computer 100 is also embodied in a decentralized fashion, but it is distributed among the computers 102 located in the buildings 104, or implemented thereon. In contrast to the illustration in FIG. 2, a decentralized computing load distribution computer 100a to 100d does not have to be present on each computer 102. With this exemplary design, all the computers 102 and all the computing load distribution computer units 100a to 100d are connected via the Internet 110 by means of a peer-to-peer network to form a cloud environment.

FIG. 4 shows an embodiment of a heating system. Emphasis is placed here on the computer 402 as a heat source and the transmission of its heat to a heat distributing device of a building heating system. A more detailed description of the heat distributing device is given in relation to FIG. 6. In order to cool the computer 402, fresh air 442 is sucked in from the outside by means of a blower 430 and passes into a filter 434. A changeover switch 442, which directs the sucked-in fresh air 422 either to a bypass 440 or to a heat exchanger 420, is arranged downstream of the filter 434. The bypass 440 is connected to the computer 402 or the computer housing. The heat exchanger 420 is also connected to the computer 402. Fresh air 422 therefore passes into the computer 402 either via the heat exchanger 420 or via the bypass 440. The computer 402 is connected to a heat distributing device of the building (not illustrated in the figure), with the result that waste heat taken up by the fresh air 422 can be fed to the heating system and/or to the building as intake air 424. A further connection between the computer 402 and the heat distributing device is configured to feed discharged air 426 from the heating system and/or the building via a filter 436 back to the computer 402. The air path of the discharged air 426 is separated from the air path of the fresh air 422 in the computer 402. Furthermore, the computer has a second connection to the heat exchanger 420, with the result that air which is to be conducted from the computer 402 to the outside (the external environment to the building is meant by this) can output its residual heat, by means of the heat exchanger 420, to fresh air 422 flowing into the computer 402 through the heat exchanger 420. Air which is to be conducted away to the outside from the computer 402 can, however, also exit the computer 402 via a further bypass 440. A further blower 432, which is intended to facilitate the transportation away of the exit air 428, is attached to the output of the heating system where air is to be conducted away to the outside as exit air 428.

For example, two different modes are provided for the feeding in of air in the embodiment just described of the heating system. It may be necessary, for example in the case of cold external temperatures, for the fresh air 422 which flows in from the outside to have to be pre-heated. The air is then fed in via the heat exchanger 420 in which pre-heating of the fresh air 422 takes place. The pre-heated fresh air 422 then passes into the computer and therefore cools its components. The fresh air 422 is strongly heated up by the waste heat of the computer 402 and is then fed as intake air 424 to the heat distributing device (not illustrated), with the result that it can be distributed in the building. After the intake air 424 has therefore output its waste heat, it is conducted as discharged air 426 into the heat exchanger 420 by a bypass in the computer (not illustrated) and is then able to preheat the fresh air 422 entering the heating system. The discharged air 426 is then let out of the heat exchanger 420 as exit air 428 from the heating system by means of the blower 432.

If the fresh air 422 does not have to be pre-heated, for example in the case of relatively warm external temperatures, it is conveyed via the bypass 438 into the computer 402 where it can take up the waste heat of said computer 402. The air which is heated in this way is made available as intake air 424 to the heat distributing device and can output heat to the building or to the heat distributing device. After the waste heat has been output, the air passes as discharged air 426 into the computer and can take up the waste heat thereof again. The discharged air 426 is then sucked in from the blower 432 via the bypass 440 and then exits the heating system again.

Provision is also made for the case in which the computer is to be cooled but no heat can be taken up by the heat distributing device or the building, for example in high summer. In this case, after fresh air 422 enters the computer 402 through the bypass 438 and after the waste heat has been absorbed, said fresh air 422 is discharged from the computer 402 again directly via a further bypass structure (not illustrated in FIG. 4), with the result that the waste heat of the computer is not output to the heat distributing device of the building.

Figure 4A:
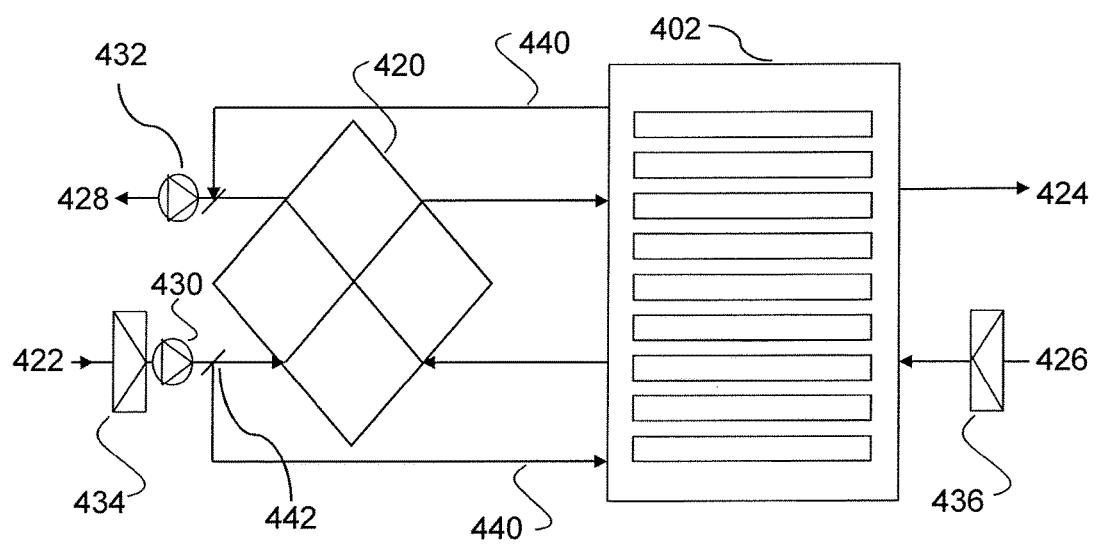
FIG. 4A shows a heating system without a heat accumulator according to various embodiments.
Figure 4B:
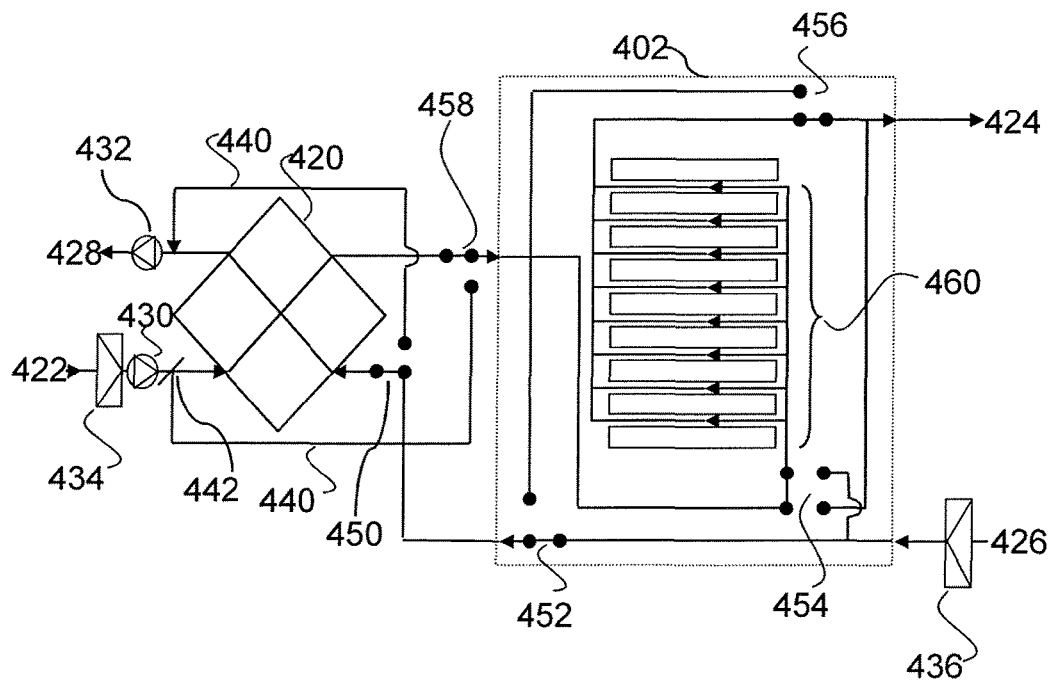
FIG. 4B shows a configuration of an air feed system of a heating system without a heat accumulator according to various embodiments.
Figure 4C:
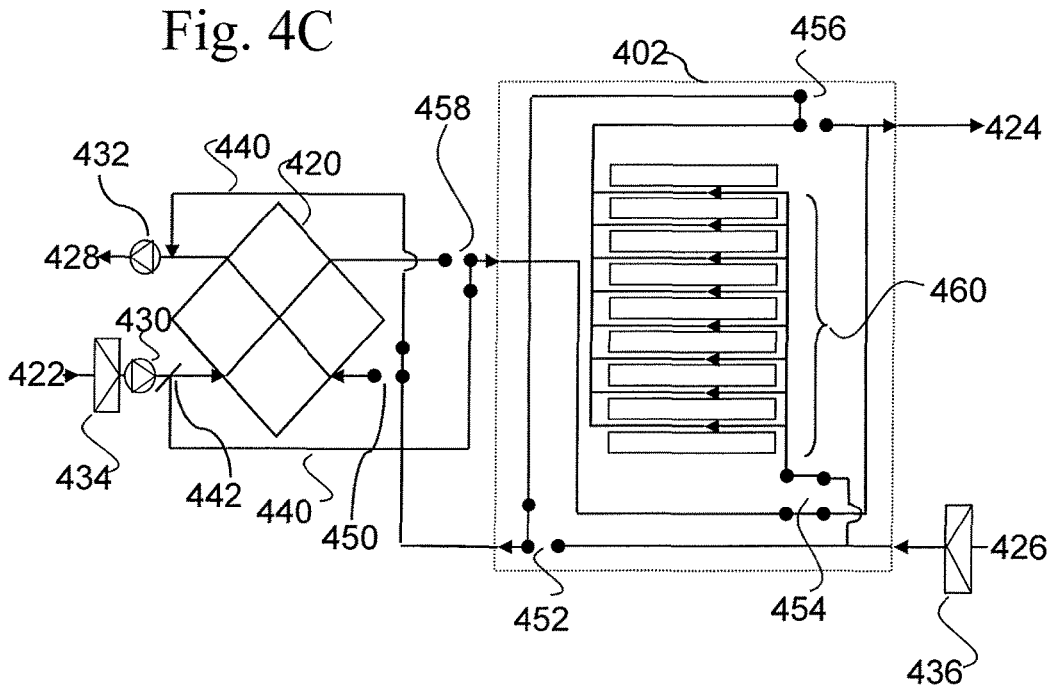
FIG. 4C shows a further configuration of an air feed system of a heating system without a heating accumulator according to various embodiments.

FIG. 4B and FIG. 4C each show the embodiment of a heating system which is illustrated in FIG. 4A, wherein the means of feeding in air are illustrated in relatively large detail. Only the aspect of the feeding in of air is explained in more detail below since the embodiment of a heating system which is illustrated in FIG. 4B and in FIG. 4C corresponds structurally to that from FIG. 4A, with the result that the components also have the same reference symbols. As can be seen in FIG. 4A and in FIG. 4B, a plurality of air feed switchover elements 450, 452, 454, 456, 458 are arranged in the air feed path. The air feed switchover elements may be sections of the guiding system for guiding the fluid, for example air, which can be closed or opened or whose connection can be changed dynamically. The closing, opening and/or changing of the connection can be carried out, for example, by means of flaps and/or any desired valves, for example air feed flaps and/or disk valves and/or ball valves. Depending on the position of the air feed switchover elements 450, 452, 454, 456, 458 it is possible to change the air feed path and as a result adapt it to the respective requirements. The position of the air feed switchover elements 450, 452, 454, 456, 458 can be changed at any time and said position can be controlled, for example, by the control device. In the text which follows, two exemplary position configurations of the air feed switchover elements 450, 452, 454, 456, 458 are described.

In the embodiment illustrated in FIG. 4B, fresh air 422 which is fed in from the external surroundings of the building is directed through the heat exchanger 420 to the air feed switchover element 458 and is then fed to the air feed switchover element 454. The air feed switchover element 454 is set here in such a way that it directs the fresh air 422 into a waste heat absorption area 460 of the air feed path, as a result of which the fresh air 422 can absorb the waste heat of the components of the computer 402, after which the heated air can be fed as intake air 424 to the air distributing system or the building through the air feed switchover element 456. The discharged air 426 from the heating system and/or the building is directed to the heat exchanger 420 through the air feed switchover elements 454 and 452 while bypassing the waste heat absorption area 460, and said discharged air 426 subsequently leaves the heating system and/or the building via the blower 432 as exit air 428. This position configuration of the air feed switchover elements 450, 452, 454, 456, 458 corresponds to the case already described in relation to FIG. 4A in which preheating of the fresh air 422 which flows in from the outside is desired, for example in the case of cold external temperatures.

In the embodiment illustrated in FIG. 4C, fresh air 422 which is fed to the building from the external surroundings of said building is directed through the bypass 440, that is to say while bypassing the heat exchanger 420, to the air feed switchover element 458 and is then fed to the air feed switchover element 454. The air feed switchover element 454 is set here in such a way that the fresh air 422 can be fed as intake air 424 to the heat distributing system or the building through the corresponding set air feed switchover element 456, while bypassing the waste heat absorption area 460. The waste heat 426 from the heating system and/or the building is directed through the air feed switchover element 454 to the waste heat absorption area 460 after which it is directed to the bypass 440 through corresponding settings of the air feed switchover elements 456, 452 and 450. Subsequently, the discharged air 426 exits the heating system and/or the building as exit air 428 via the blower 432. This position configuration of the air feed switchover elements 450, 452, 454, 456, 458 corresponds to the case already described in which pre-heating of the inflowing fresh air 422 from the external surroundings is not desired, for example in the case of warm external temperatures.

The position configurations of the air feed switchover elements 450, 452, 454, 456, 458 just described constitute only two exemplary configurations. It is clear that many further expedient position configurations are possible by means of the illustrated air feed system which is presented in more detail in FIG. 4B and in FIG. 4C on the basis of FIG. 4A. A further possible alternative is, for example, a position configuration in which the air feed switchover elements 452, 454 and 456 in the computer 402 have the position configuration which is shown in FIG. 4C, and the air feed switchover elements 452 and 458 have the position configuration shown in FIG. 4B. As a result it is possible to ensure that instead of the intake air 424 the discharged air 426 is warmed up. This could be useful, for example, in order to prevent the heat exchanger 420 from freezing in the case of fresh air temperatures below 0° C.

FIG. 5 shows a modified embodiment of the heating system shown in FIG. 4. The air is fed in here in a way analogous to the embodiment shown in FIG. 4. In addition, a heat accumulator 448 is provided which can absorb the waste heat of electrical components, for example the CPU (central processing unit) 444 by means of a thermal coupling 446. The thermal coupling can be implemented by means of a solid and/or fluid heat transfer medium and is not restricted to the absorption of heat from the CPU 444 but instead can also absorb heat from other electronic components of the computer 402. For example, the thermal coupling may include heat being conducted away by means of heating pipes. The heat accumulator 448 can be provided, for example, for the hot water supply in the building and/or can supply heating elements in the building with heat.

Figure 5A:
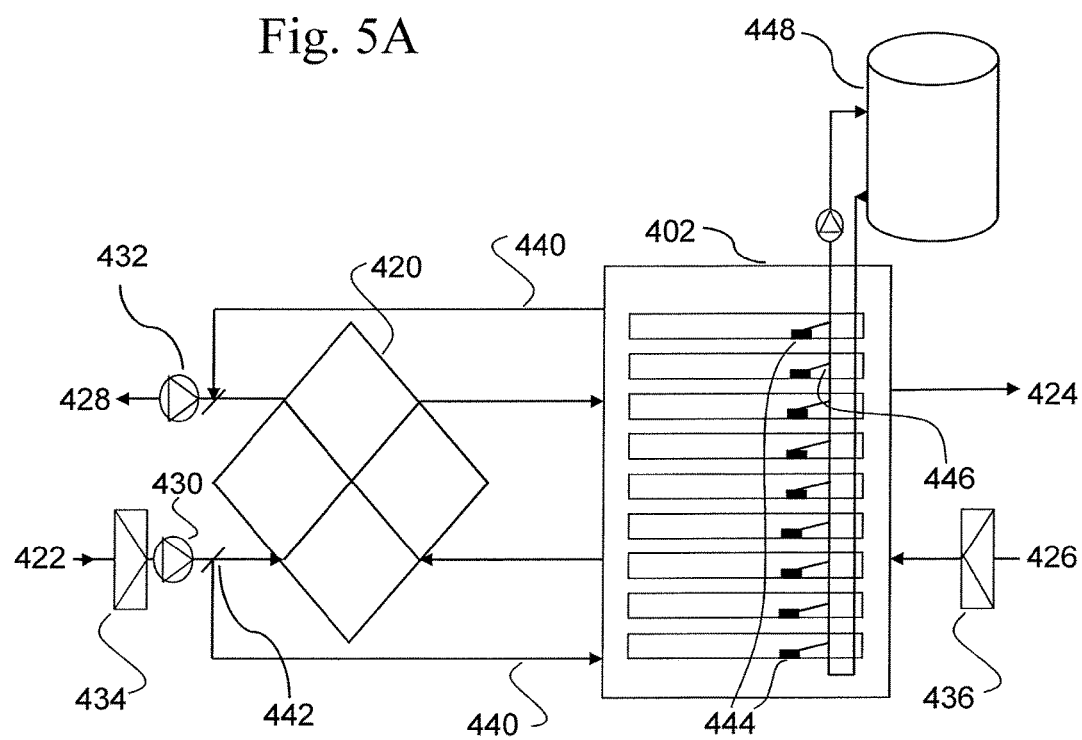
FIG. 5A shows a heating system with a heat accumulator according to various embodiments.

By analogy with FIG. 4B and FIG. 4C, FIG. 5B and FIG. 5C show the embodiment of a heating system with a heat accumulator 448 which is illustrated in FIG. 5A, wherein the means for feeding air are illustrated in greater detail. The two position configurations (illustrated by way of example in FIG. 5B and FIG. 5C) of the air feed switchover elements 450, 452, 454, 456 and 458 are analogous to the position configurations illustrated in FIG. 4B and FIG. 4C. The only difference is that a heat accumulator 448 is provided which, however, does not change the method of functioning of the air feed switchover elements 450, 452, 454, 456 and 458. As a result, all the statements relating to the position configurations of the air feed system which are illustrated in FIG. 4B and FIG. 4C also apply to the position configurations of the air feed system according to FIG. 5B and FIG. 5C. The embodiments (illustrated in FIG. 5B and in FIG. 5C) of a heating system can also have an optionally present water/air heat exchanger 462 which can be connected into the circuit as required. The latter can be connected into the circuit when, for example, the accumulator is full and nevertheless it is intended to continue to operate the computer. The waste heat can then be discharged to the external surroundings of the building by means of the water/air heat exchanger 462. Such a case can occur, for example, at warm external temperatures.

Figure 5B:
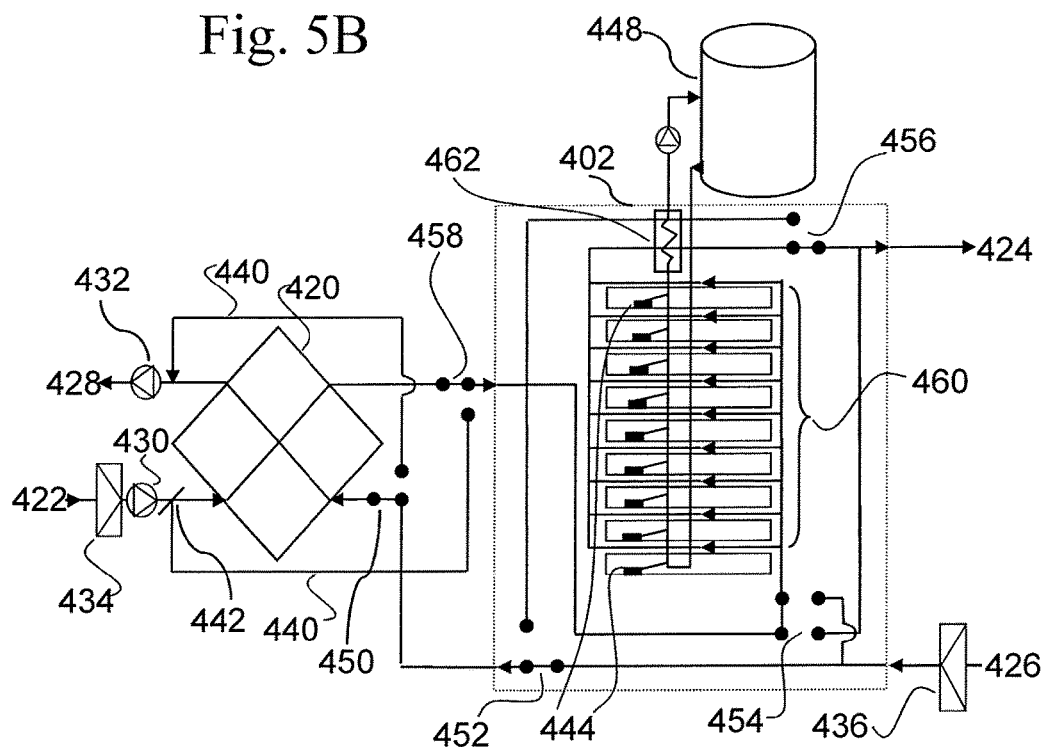
FIG. 5B shows a configuration of an air feed system of a heating system with a heat accumulator according to various embodiments.
Figure 5C:
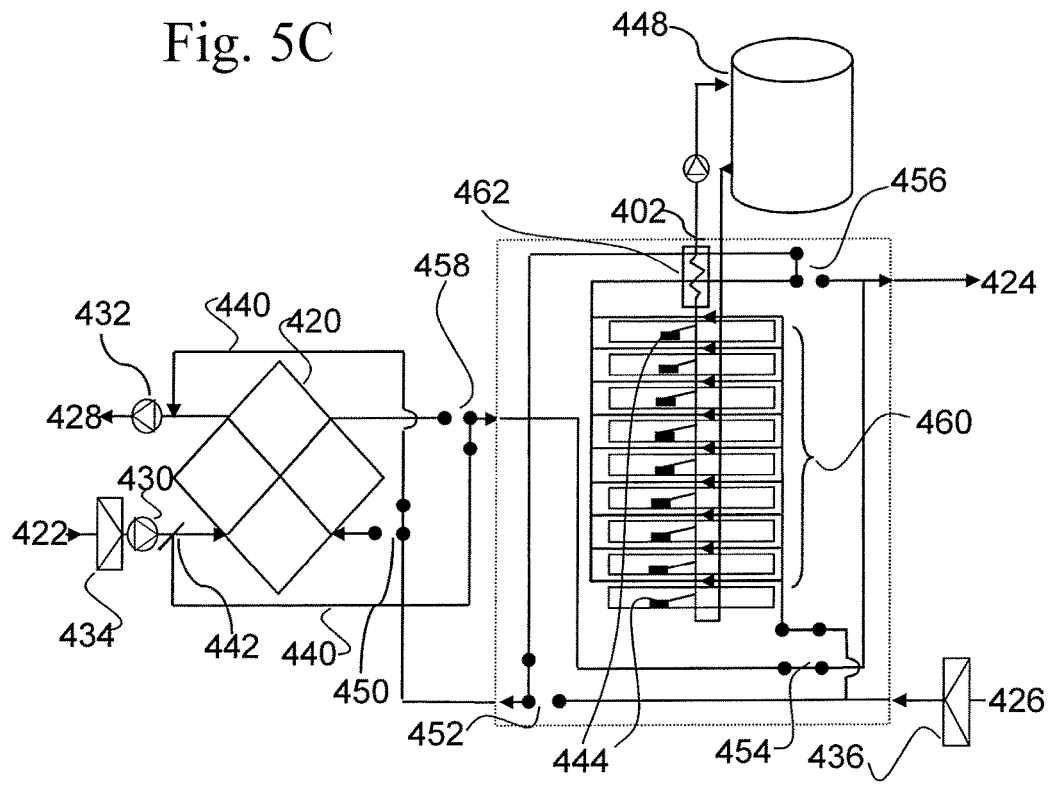
FIG. 5C shows a further configuration of an air feed system of a heating system with a heat accumulator according to various embodiments.

Although only the computer 402 is illustrated as a heat source in the embodiments of the heating system which are shown in FIG. 4A, FIG. 4B, FIG. 4C and in FIG. 5A, FIG. 5B and FIG. 5C, the heating system can, of course, have further heat sources, in particular in old, poorly insulated buildings, whose heating requirement cannot be covered from the operation of the computer alone. It is therefore possible, for example, to have a heating boiler which is fired with coal or oil, or a solar system, which either supplies current directly (photovoltaic system) or thermal energy (solar thermal system) and/or an air/air or air/water or water/air heat pump, can be connected to the heating system. The computer 402 or the computer housing together with the air feed and air discharge connections has a footprint of approximately 1 square meter or less.

Figure 6:
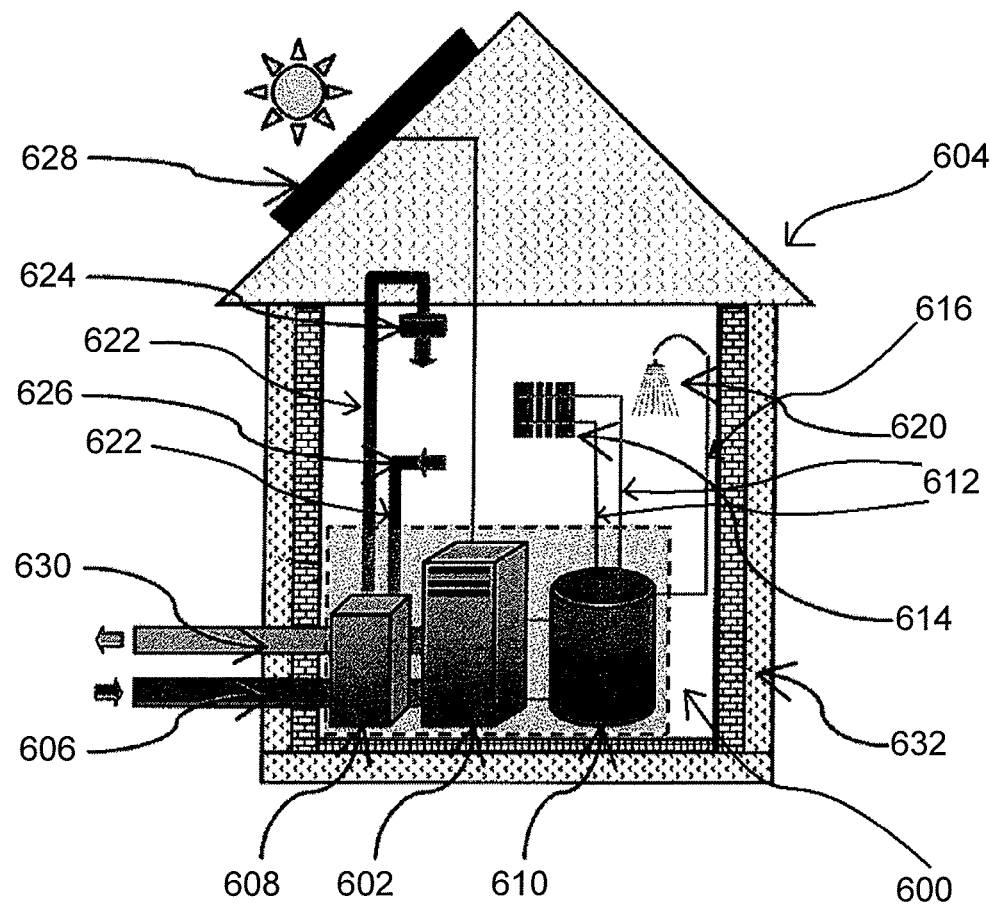
FIG. 6 shows a heating system according to various embodiments.

FIG. 6 shows a schematic overview of a heating system 600 which is integrated into a building 604, according to various embodiments. Fresh air 606 is sucked in from outside the building 604 in order to cool the computer 602. The fresh air 606 can be directed through the heat exchanger 608 and directed from there into the computer 602. However, as illustrated in FIG. 4 and FIG. 5, the fresh air 606 can also be directed directly into the computer 602 or the computer housing where said fresh air can absorb the waste heat of the computer 602. The waste heat of the computer 602 is distributed in the building 604 via the heat conduction system. The heat conduction system has devices such as, for example, lines, valves, flow regulators and/or further heat exchangers (all the elements just mentioned are not explicitly illustrated in FIG. 6), which devices are suitable for distributing heat from the computer 602 and/or from the heat accumulator 610 (also referred to as a buffer accumulator) which is coupled by heating technology to the computer 602 and/or from any desired further heat source, for example a photovoltaic and/or solar system 628, in the building 604. In the design shown in FIG. 6, these are, for example, lines or pipes 612 which supply heat to heating elements 614 in the building, lines or pipes 616 which supply hot water 620 to the building, and lines 622 which discharge fresh air 606 heated up by the computer into the rooms in the building 604 as intake air 624 in order to control the temperature, and carry away this discharged air 626 from the rooms of the building 604. The heat in the building can be provided, for example, by means of a gas and/or a liquid and/or a solid medium in the lines or pipes of the heat distributing device. Such a heat distributing device may also be present in conventional buildings such as, for example, residential buildings or office buildings, and can be used to distribute the waste heat of the computer 602. In order to permit complete circulation of fresh air in the computer 602 and/or in the building 604, lines are also provided which discharge air from the interior of the building 604 and/or from the computer 602 as exit air 630 to the surroundings. The building 604 which is illustrated schematically in FIG. 6 can have a highly thermally insulating external sleeve 632 in order to be able to use more efficiently the heat which is fed to it.

Figure 7:
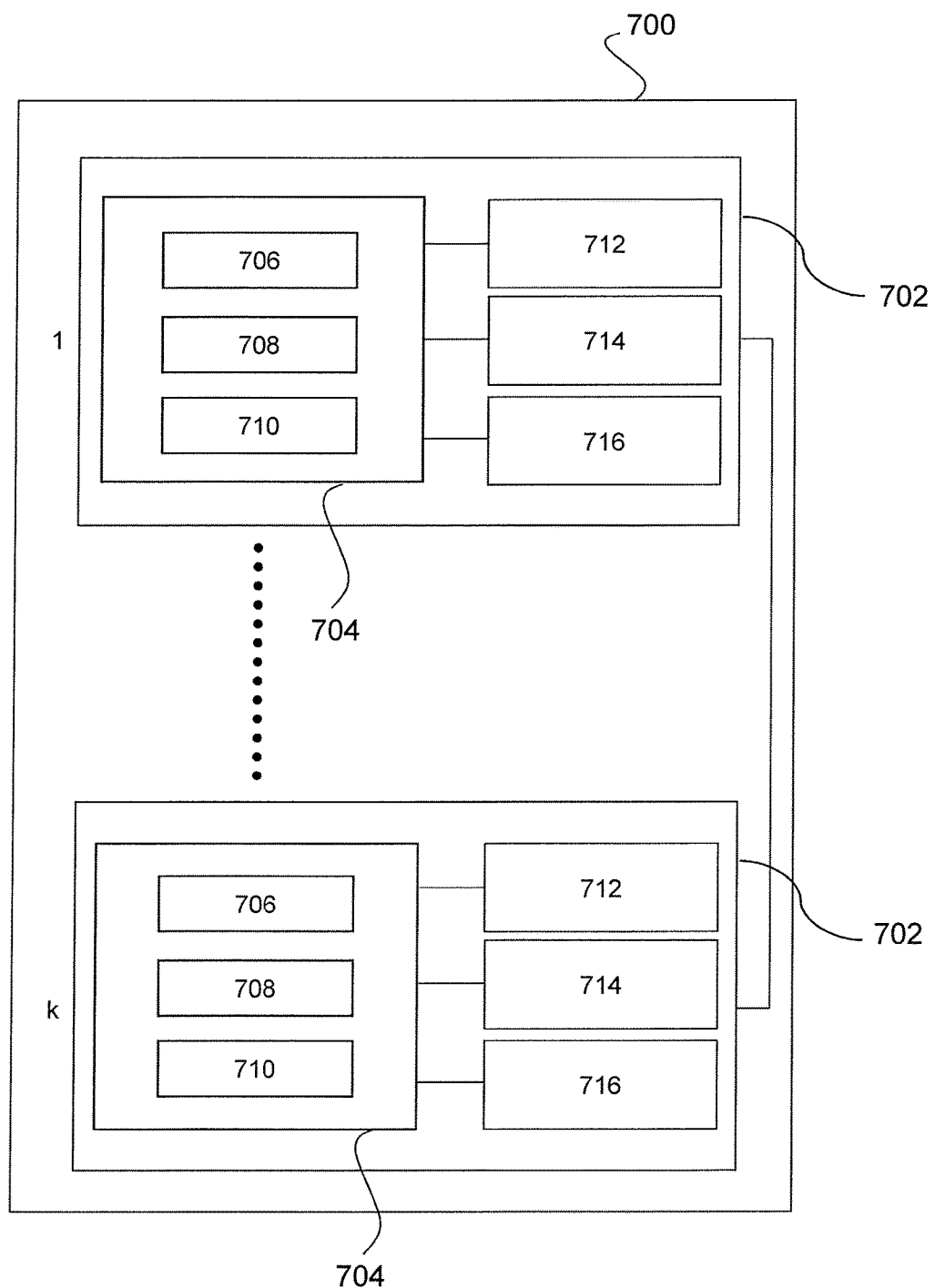
FIG. 7 shows a schematic design of a computer according to various embodiments.

FIG. 7 is a schematic illustration of a typical design of a computer 700 such as is used in a heating system according to various embodiments. Such a computer 700 usually has a customary server rack into which computing nodes 702 in the form of plug-in circuit boards can be plugged. A computing node is here a physical resource, for example a computer. In addition, a computer 700 can have heat discharge devices, for example in the form of cooling bodies and corresponding ventilation and venting devices (not illustrated) which are configured to conduct away the heat. A computer 700 according to various embodiments can usually have one or more computing nodes 702. A computing node 702 has a main board 704 with at least one CPU 706 with at least one core, either without or with a deactivated graphics processor or with at least one GPU (graphics processing unit) 708 and a working memory 710. At least one memory medium 712, for example in the form of a hard disk, of a SSD (solid state drive) or of a flash drive, at least one network adapter 714 and a power supply 716 are connected to the main board 704. The power supply 716 is generally of switchable design and can also be combined with an interruption-free power supply, with the result that controlled switching on and off of the computing node 702 is made possible in the event of a power failure, and/or brief power failures can be coped with. The computing nodes 702 are connected to one another by switching means (switch or router, not illustrated) by means of the at least one network adapter 714. The network adapter 714 also produces a connection to the outside, for example to the computing load distribution computer.

An exemplary server in 2010 would be composed of the following components: ten computing nodes each with a main board with a CPU (for example Intel Xenon) which has six cores, one, for example, four gigabyte main memory (generally a main memory of any desired size) and a graphics card. Furthermore, two hard disks of the capacity of two terabytes each and two Ethernet cards would be connected to the main board.

Figure 8:
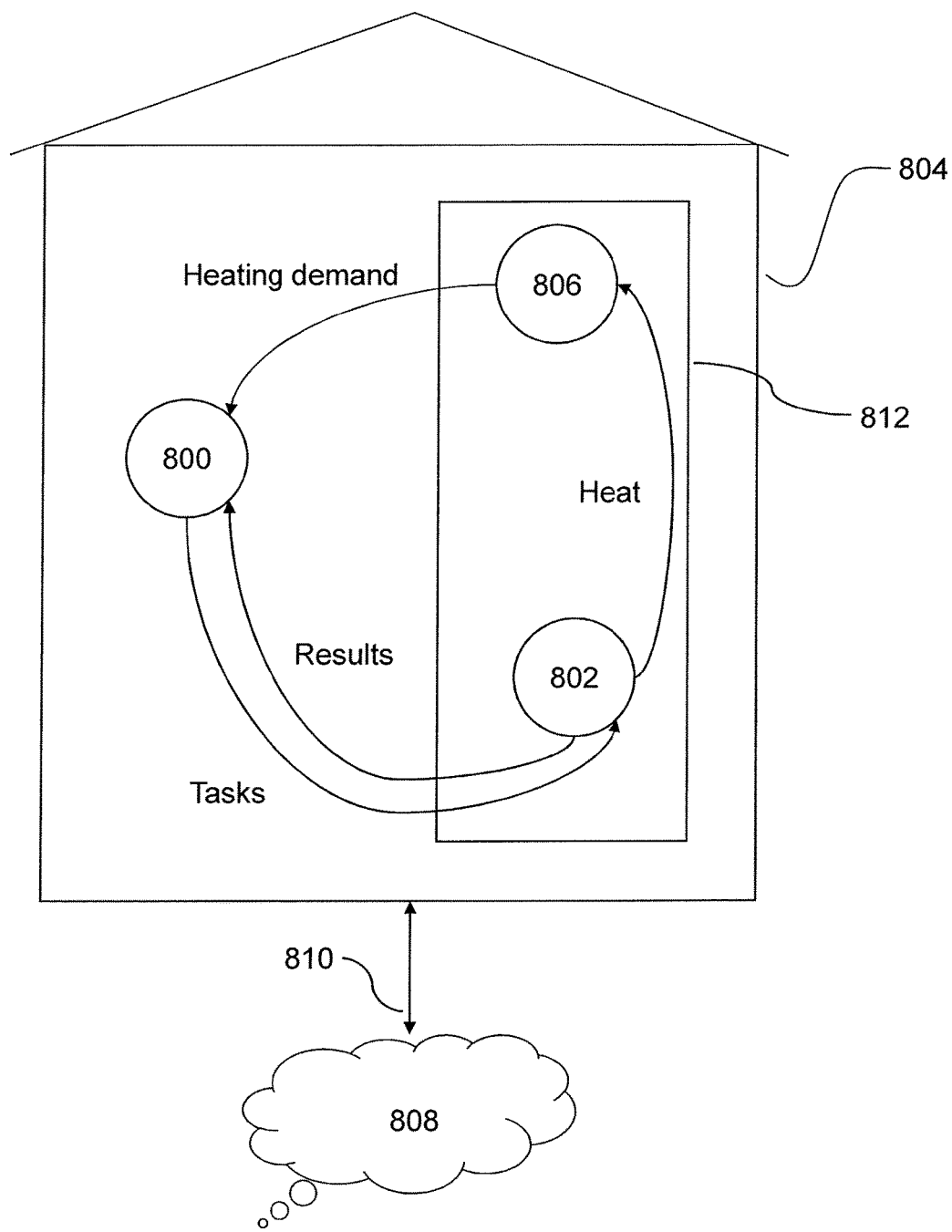
FIG. 8 shows a diagram which illustrates an interaction of the components of the heating system network according to various embodiments.

FIG. 8 illustrates the interaction of the individual components of a heating system 812 and of the computing load distribution computer 800 with one another. In this embodiment of the heating system 812, the decentralized computing load distribution computer 800 is arranged or integrated in the building 804. In addition, the heating system has a control device 806 in addition to the computer 802. In this embodiment, the control device 806 operates autonomously and is present as a separate unit, but the control device 806 could also be a component of the computer 802 or be implemented thereon. Alternatively, the computing load distribution computer 800 can also perform the functions of the control device 806. The control device 806 has the function of signaling the heating demand of the building or of the heat distributing device to the computing load distribution computer 800. This object can also be carried out by the computer 802 if the control device 806 is implemented by means of the computer 802. On the basis of the message about the heating demand of the building and/or of the heating system, the computing load distribution computer 800 requests the processing of computing tasks by the computer 802. In this context, by means of the assignment of computing tasks to the computer 802, the load thereof is adapted in such a way that the heating demand can be covered on the basis of the waste heat which is output by the computer 802 to the building. The results of the calculated computing tasks are made available here by the computer 802 to the computing load distribution computer 800. The computer 802 also transmits information relating to the generated quantity of waste heat to the control device 806. The computer of the heating system and the computing load distribution computer 800 are connected here to the cloud (computer cloud) 808 by means of a network 810 for example the Internet, via which cloud the communication is effected with further heating systems 812 and/or computing load distribution computers 800 of this type.

Figure 9:
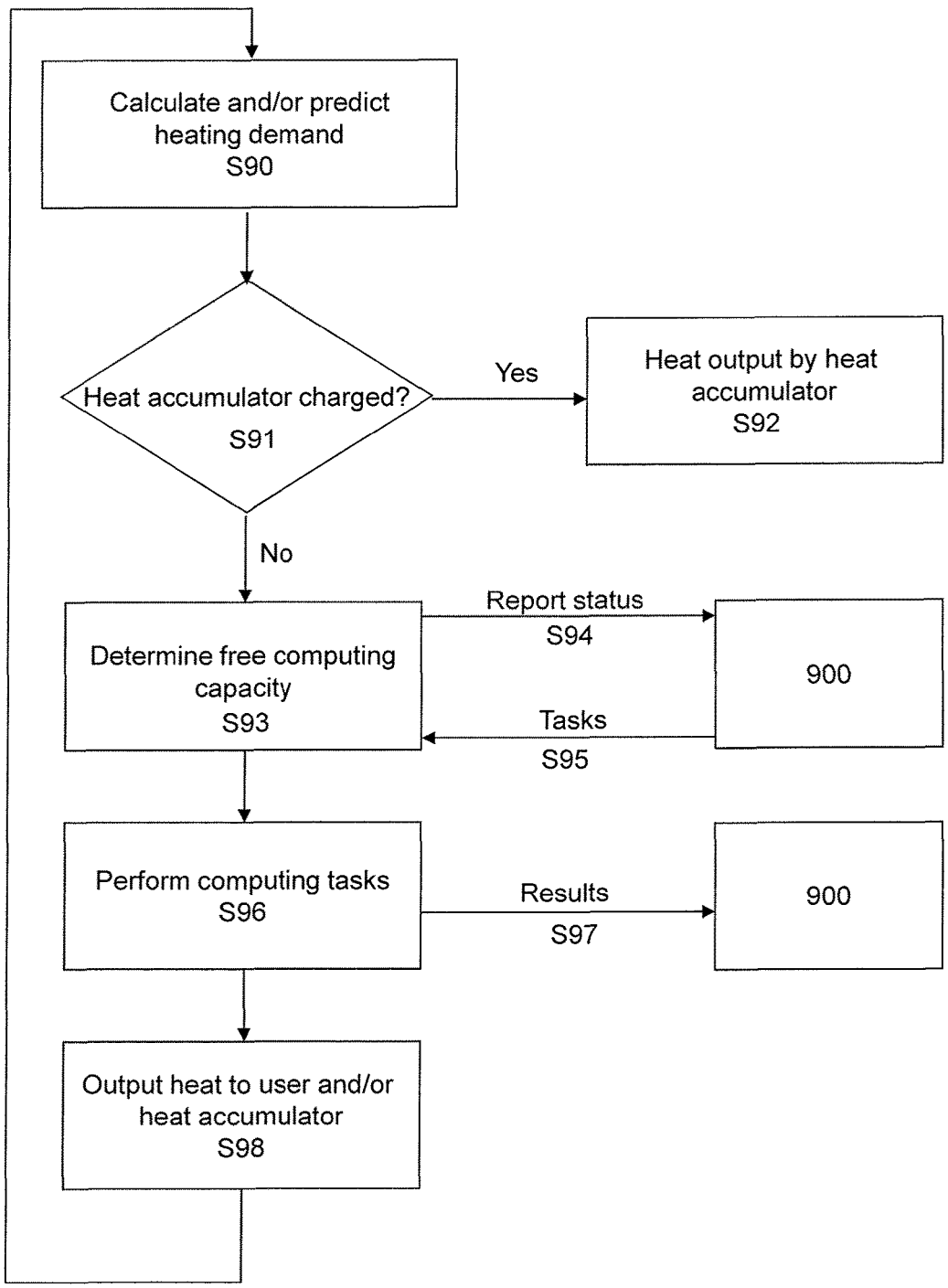
FIG. 9 shows a flow chart of a method for adapting the computing load according to the heating demand according to various embodiments.

FIG. 9 illustrates a flowchart explaining an exemplary method for the thermally modulated control of the computer. In this context, thermally modulated control means that the power consumption of the computer and/or the scope of the computing tasks whose calculation is requested of the computer by the computing load distribution computer is/are adapted in such a way that the waste heat produced by the computer can cover the heating demand. At first, in step S90 the heating requirement of the heating system and/or of the building is determined, for example by the control device. The heating requirement does not have to be determined on the basis of instantaneous state parameters (such as, for example, the instantaneous room air temperature in a respective room of the building or of the instantaneous internal temperature) but can also be predicted and/or interpolated on the basis of state parameters from the past. Then, in step S91 the state of the heat accumulator is checked, i.e. it is determined whether the heat stored therein can cover the heating demand. If there is sufficient heat present in the heat accumulator, in step S92 heat is extracted from the heat accumulator and made available to the heating system and/or the building. If there is not sufficient heat present in the heat accumulator, in step S93 the free computer capacity is determined. Computer capacity is to be understood in the sense of this application as the availability of any software and hardware for processing computer tasks and/or the full exploitation of resources present in the computer, for example processors and main memories. Subsequently, the computer generates a message, wherein the message contains information about a heating demand of the heating system and/or of the building or the status thereof. The message is transmitted in the step S94 to the computing load distribution computer 900. The message can also contain information about the free computing capacity of the computer, but this information can, however, also be contained in a separate message which is transmitted simultaneously or subsequently to the computing load distribution computer 900. On the basis of the information transmitted to it and taking into account further parameters (see FIG. 10 in this respect), the computing load distribution computer 900 generates at least one message which is transmitted to the computer in step S95, wherein calculations of computing tasks are requested by means of the at least one message. The at least one message can contain here further data which is necessary to process the computing tasks. After the reception of the request of computing tasks and the possible further data necessary for this purpose, the computer carries out the requested computing tasks in step S96 and transmits the ensuing results in step S97 to the computing load distribution computer 900. The term results is intended to refer not only to results of exemplary calculation tasks or compilation tasks but also status messages relating to any tasks carried out or executed calculations which had been requested by the computing load distribution computer. The waste heat which is produced during the processing is output here continuously in step S98 to the heating system and/or the building. The illustrated flowchart can be carried out again at any desired time interval. If it is determined that there is heating demand, the steps just described are executed. If it is determined that there is no heating demand, the further steps are not carried out and the flowchart is run through again at any desired time interval.

It should be noted that the method just described can be modified to the effect that during the outputting of heat in step S98 the heat accumulator can be additionally charged at the same time, for example, if it has been determined in step S91 that the heat accumulator is not completely charged and therefore can absorb heat. Alternatively, the outputting of heat in step S98 can also be assisted by simultaneous or superimposed outputting of heat from the heat accumulator according to step S92 if, for example, the entire heating demand which is determined cannot be covered by the waste heat of the computer.

The exemplary method illustrated in FIG. 9 can also be adapted to a heating system in which there is no heat accumulator present. In such a method, steps S91 and S92 are omitted, with the result that after the heating request in step S90 has been determined, step S93 follows in which the free computing capacity is determined. Correspondingly, in step S98 the heat can be output only to the heating system and/or the building since there is no heat accumulator present.

Figure 10:
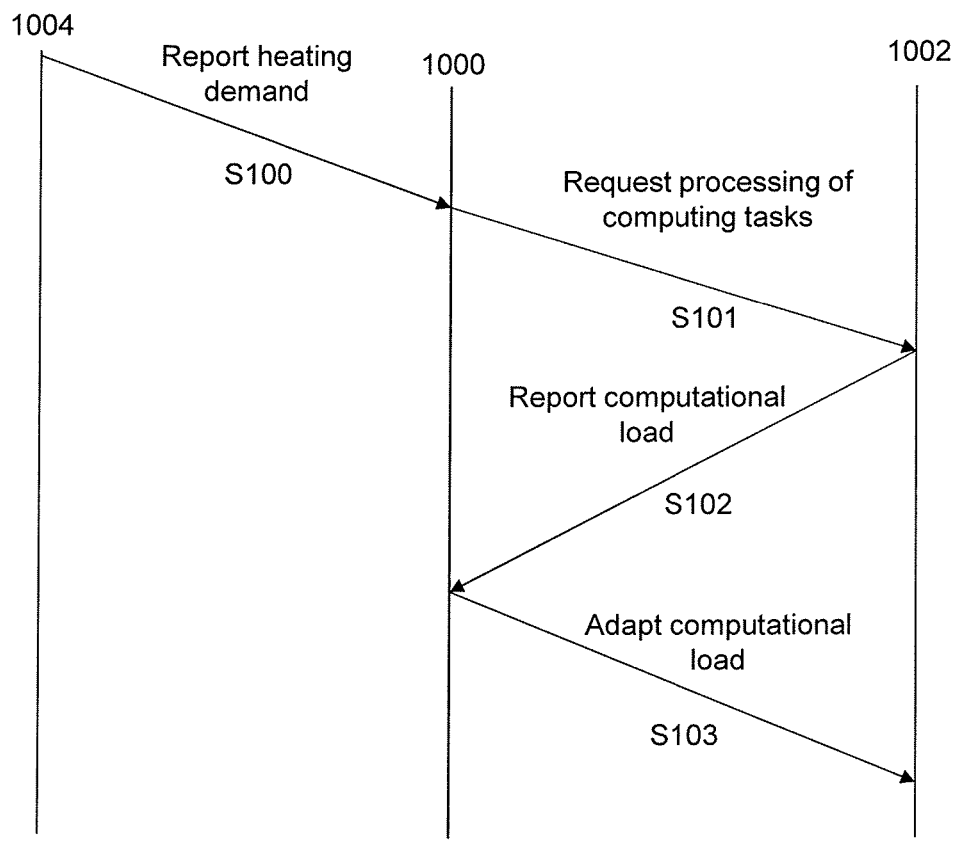
FIG. 10 shows a sequence diagram of a method for adapting the computing load at the computer according to various embodiments.

FIG. 10 illustrates a sequence diagram which illustrates an embodiment of a method for adapting the computing load to the computer 1002. The method starts with determination of the heating demand of the heating system and/or of the building by the control device 1004. In step S100, information about the heating demand of the heating system and/or of the building is transmitted to the computing load distribution computer 1000. On the basis of this information and further parameters explained in more detail below, the computing load distribution computer 1000 requests, in step S101, the processing of computing tasks by the computer 1002 and possibly transmits to the latter further data which are necessary for processing the computing tasks. During its operation, the computer 1002 signals its operating state to the computing load distribution computer 1000 in step S102. Possible data items which describe the operating state of the computer 1002 are, for example, its capacity utilization, its computing capacity or, for example, the temperature of the processors. The computing load distribution computer 1000 can then adapt its load in step S103 on the basis of the message relating to the operating state of the computer 1002, which is transmitted to it, wherein further independent parameters are taken into account which will be explained in more detail below with reference to FIG. 11. The operating state of the computer 1002 can be adapted, for example, by stopping and/or resuming and/or adding and/or removing computing tasks. It is also possible to place at least one computing node in one of the energy saving modes, or computing nodes can be activated again from one of the energy saving modes. It is also possible to power down at least one computing node if, for example, the computing load were to turn out to be too small for the corresponding computing node, or it can be powered up from a switched-off state in which it does not consume any current if, for example, more computing load occurs than is determined by the heating demand of the building and/or by the hot water preparation means.

Figure 11:
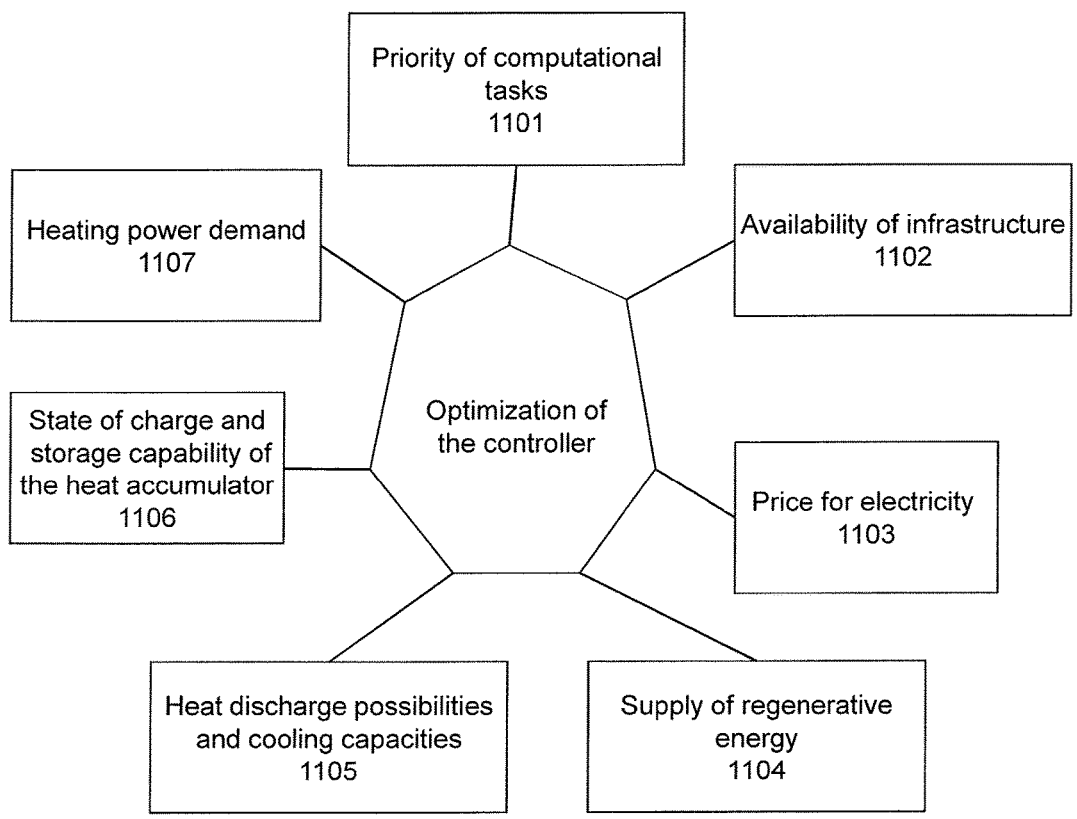
FIG. 11 shows a compilation of factors which influence the operating state of the computer, according to various embodiments.

FIG. 11 compiles, for example, factors which can influence the operating state of the computer. As already explained, the load of the computer is primarily heat-modulated, that is to say adapted in such a way that the waste heat of the computer can cover the short-term, medium-term and long-term heating demand of the heating system and/or of the building, which constitutes one 1107 of the factors which are taken into account in the distribution of the computing tasks by the computing load distribution computer to the computers. The operating state of the computer 1100 and/or the distribution of computing tasks are/is adapted to at least one computer, the computing load distribution computer can, however, take into account further factors, for example the priority of a task 1101 which is to be calculated, wherein a time-dependent change in priority can take place and computing tasks with a high priority can, under certain circumstances, be distributed without considering the heating demand, with the request for immediate processing; availability of the infrastructure 1102, in particular in respect of current and Internet (for example fluctuations in the bandwidth at different times of day); price 1103 paid for electricity, wherein both instantaneous and predicted values can be taken into account; supply of regenerative energy, in particular taking into account fluctuations in the solar-generated current or wind-generated current at different times of day; heat discharge possibilities and cooling capacities 1105, which are relevant, in particular, at high temperatures during the summer; state of charge and storage capability of the heat accumulator/accumulators 1106 (for example water storage means or thermal activation of components). Each of the factors specified here can be supported during its determination and/or calculation on currently interrogated or determined values or on predicted values. It is therefore possible, for example during the determination of the price of electricity, for the current price at the electricity stock market to be obtained or else a predicted price for electricity can be derived for the respective time of day from corresponding values in the past.

Figure 12:
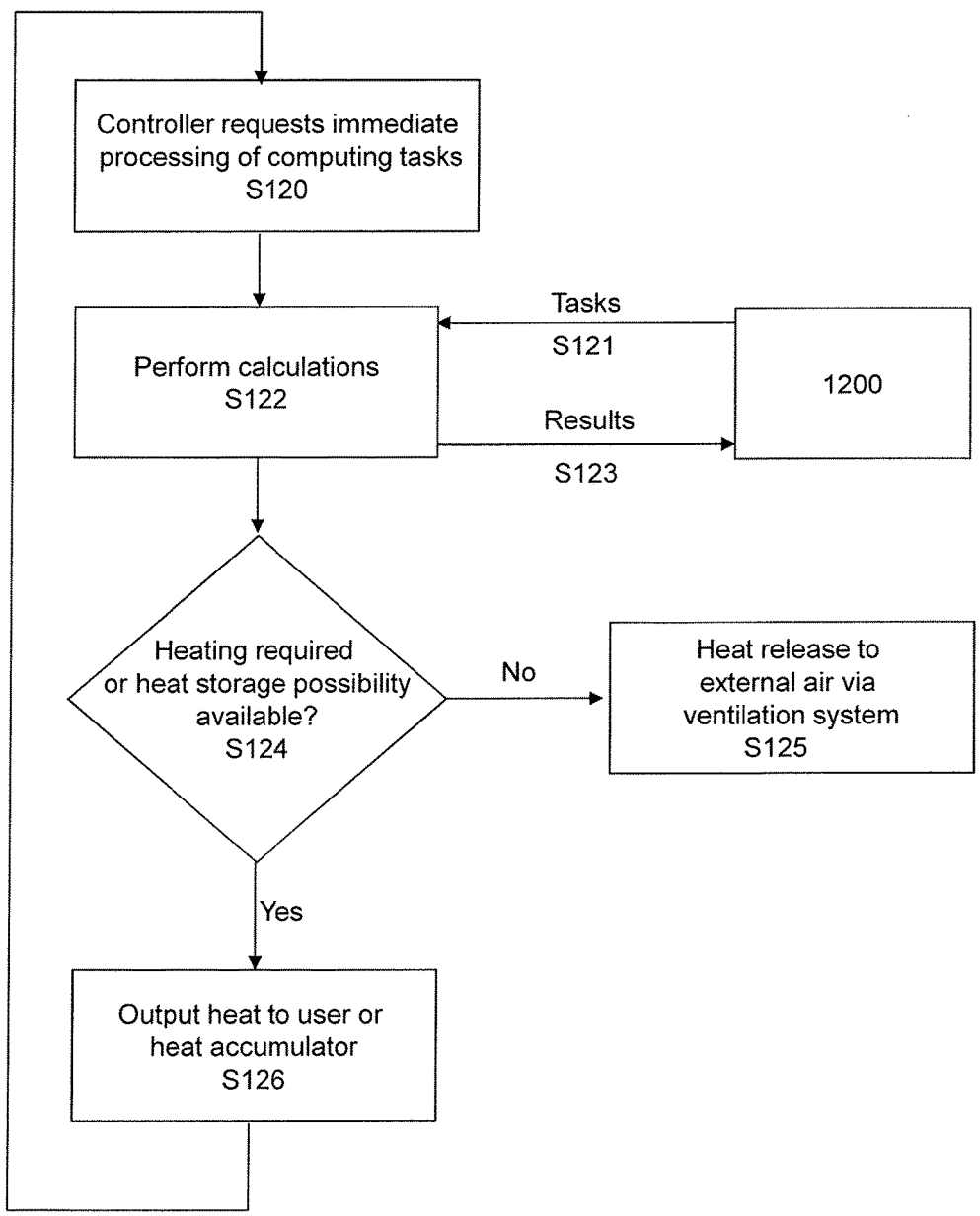
FIG. 12 shows an illustration of the handling of high-priority computing tasks according to various embodiments.

FIG. 12 illustrates a flowchart of an exemplary method by means of which tasks with high priority and/or tasks which require immediate execution are handled. In the case of tasks of this type, which are distributed as quickly as possible on the computers, it is not always possible, for economic reasons relating to the operation of a computer grouping, which is to be considered equivalent to a computing center, to take into account the current heating demand of the heating systems and/or buildings whose computers are involved in the processing of the computing tasks with a high priority. In other words, it is possible that the processing of computing tasks is requested even though the heating system and/or the building does not have any heating demand and/or the heat accumulator is fully charged. Such a scenario is described in more detail below. In step S120, the computing load distribution server 1200 requests the immediate processing of computing tasks and transmits the computing tasks or the data necessary for their processing to the computer in step S121. In step S122, the computer carries out the requested calculations and in step S123 it supplies results to the computing load distribution computer 1200. During the processing of the computing tasks, it is determined in step S124 whether the generated waste heat can be output to the heating system and/or the building, including a possibly present heat accumulator. If no heat can be absorbed by the heating system and/or the building at the requested time and/or heat cannot be stored in the heat accumulator (this can also include, if one is present, an indoor or outdoor swimming pool), the waste heat which is produced is output to the external air in step S125, for example via the bypass circuit which is correspondingly activated by means of a controller. Alternatively, a cooling unit, which is operated by means of a fluid medium and is installed outside the building, can be used (not illustrated) to conduct away the waste heat. Correspondingly in step S126 at least some of the waste heat can be output to the building or to the heat accumulator if capacities for absorbing heat are present.

Figure 13:
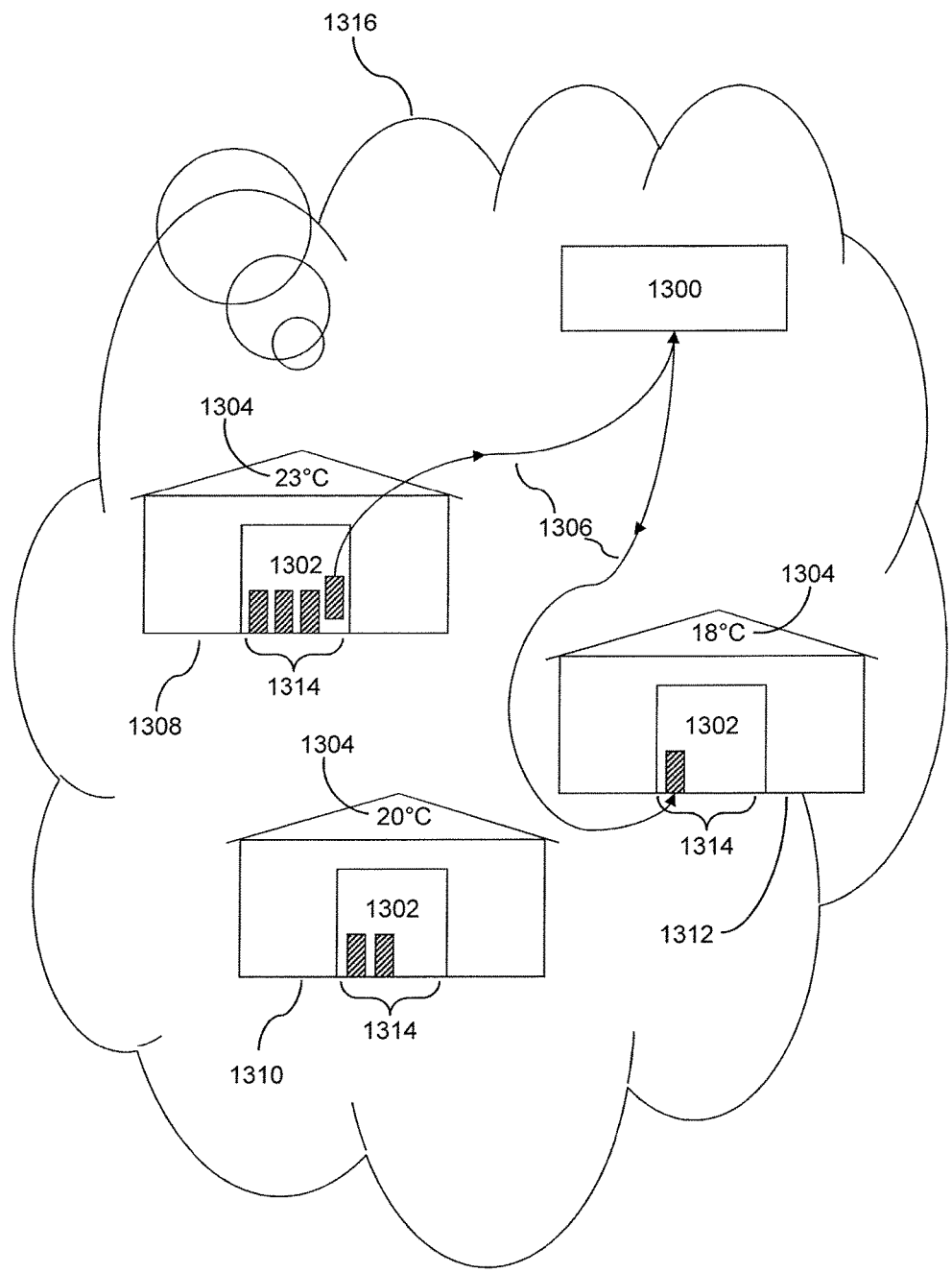
FIG. 13 shows a scenario for distributing the load between computers of different heating systems according to various embodiments.

As already stated, the heating system according to various embodiments makes available a means of heating a building in an efficient and environmentally friendly fashion. In FIG. 13, a further aspect of the heating system network is clarified, specifically load redistribution and/or load distribution which is controlled by the heating demand of a respective building. In the embodiment, three buildings 1308, 1310 and 1312 are connected to a central computing load distribution computer 1300 to form a cloud 1316. Each of the buildings has a computer 1302, wherein the number of bars 1314 is intended to indicate the instantaneous computing load of the respective computer 1302. In addition, an interior temperature 1304 is specified symbolically at each building by means of the number of degrees. In this case, redistribution of the computing load, indicated by the arrow 1306, takes place from a computer with a high capacity utilization rate and/or low heating requirement of the associated heating system and/or building, such as in the case of computer 1302 in the building 1308 with an interior temperature 1304 of 23° C. and a heavily loaded computer 1302, to a computer with low capacity utilization rate and/or a high heating requirement of the associated heating system and/or building, as is the case in the computer 1302 in the building 1312 with an interior temperature 1304 of 18° C. This redistribution of computing tasks occurs, for example, in a way which is transparent to the operator initiating the computing tasks (i.e. it is not clear to him that the computing tasks are processed in a distributed fashion in this computer grouping), preferably in real time and without user intervention (for example in the form of a relocation of a virtual machine).

Figure 14:
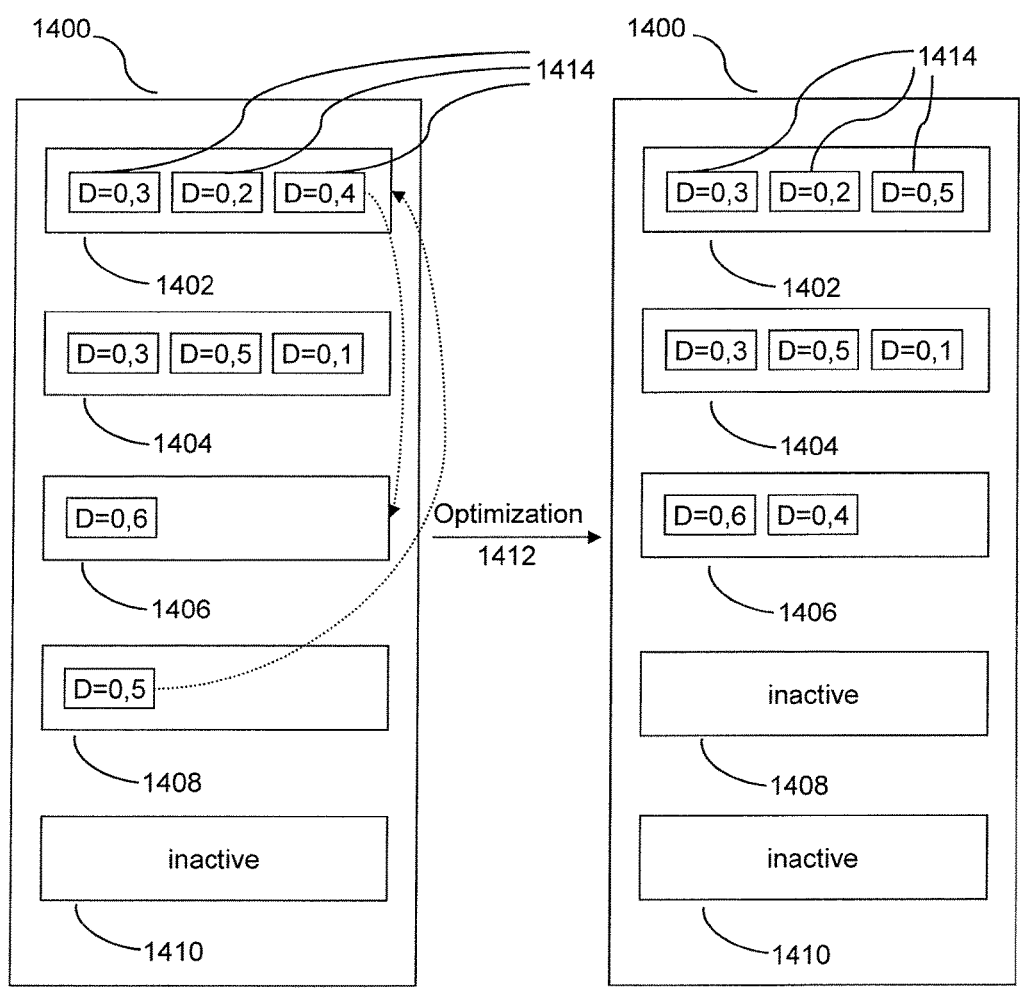
FIG. 14 shows a method for optimizing the operating state of the computer according to various embodiments.

A further optimization process of the heating system can run at the level of the computer and is illustrated in FIG. 14. This involves the adaptation of the computing load of individual computing nodes of a computer such that the power per watt is optimized. In the example, a computer 1400 is illustrated schematically, said computer 1400 having a plurality of nodes 1402, 1404, 1406, 1408 and 1410, the first four computing nodes 1402, 1404, 1406, 1408 of which are supplied with computing tasks 1414 before optimization 1412, and the last computing node 1410 is inactive. The computing load which is applied to a corresponding computing node by each computing task is given by the numerical value in the respective small box representing the computing task 1414. The sum of the computing loads in a computing node is between 0 and 1, where 0 is idling and 1 is full capacity utilization. From the diagram it is apparent that before the optimization 1412 the first node 1402 operates with a capacity utilization rate of 0.9, the second node 1404 with the capacity utilization rate of 0.9, the third node 1406 with a capacity utilization rate of 0.6 and the fourth node 1408 with a capacity utilization of 0.5. The optimization process 1412 then has the objective of maximizing the capacity utilization of a computing node, as a result of which, if appropriate, one or more computing nodes are freed of computing tasks and can be switched off by powering them down, with the result that they do not consume any energy and also do not make available any thermal energy (apart from the residue heat which is usually output). The compression of the computing tasks onto the computing nodes allows the energy which is used for the operation thereof to be utilized more efficiently. In the present example, the computing load distribution (load balancing) is carried out by consolidation and migration. The computing tasks 1414 can therefore be combined appropriately and when necessary shifted between the computing nodes by means of the switching devices (for example layer 7 or layer 4 switches, not illustrated in FIG. 14). If virtual machines are implemented by means of one or more of the computing nodes 1402, 1404, 1406, 1408 and 1410, said virtual machines can be relocated from one computing node to another computing node by live migration (real time migration) without the virtual machines having to be switched off. After optimization 1412 has been carried out, it is possible, as illustrated in FIG. 14, for the advantageous situation to arise in which a relatively small number of computing nodes is necessary for the calculation of the same computing tasks 1414. In the example given, the capacity utilization rates of the computing nodes 1402, 1404 and 1406 are 1, and computing node 1408 is now inactive, precisely like computing node 1410, with the result that said computing node 1408 can be powered down.

Figure 15:
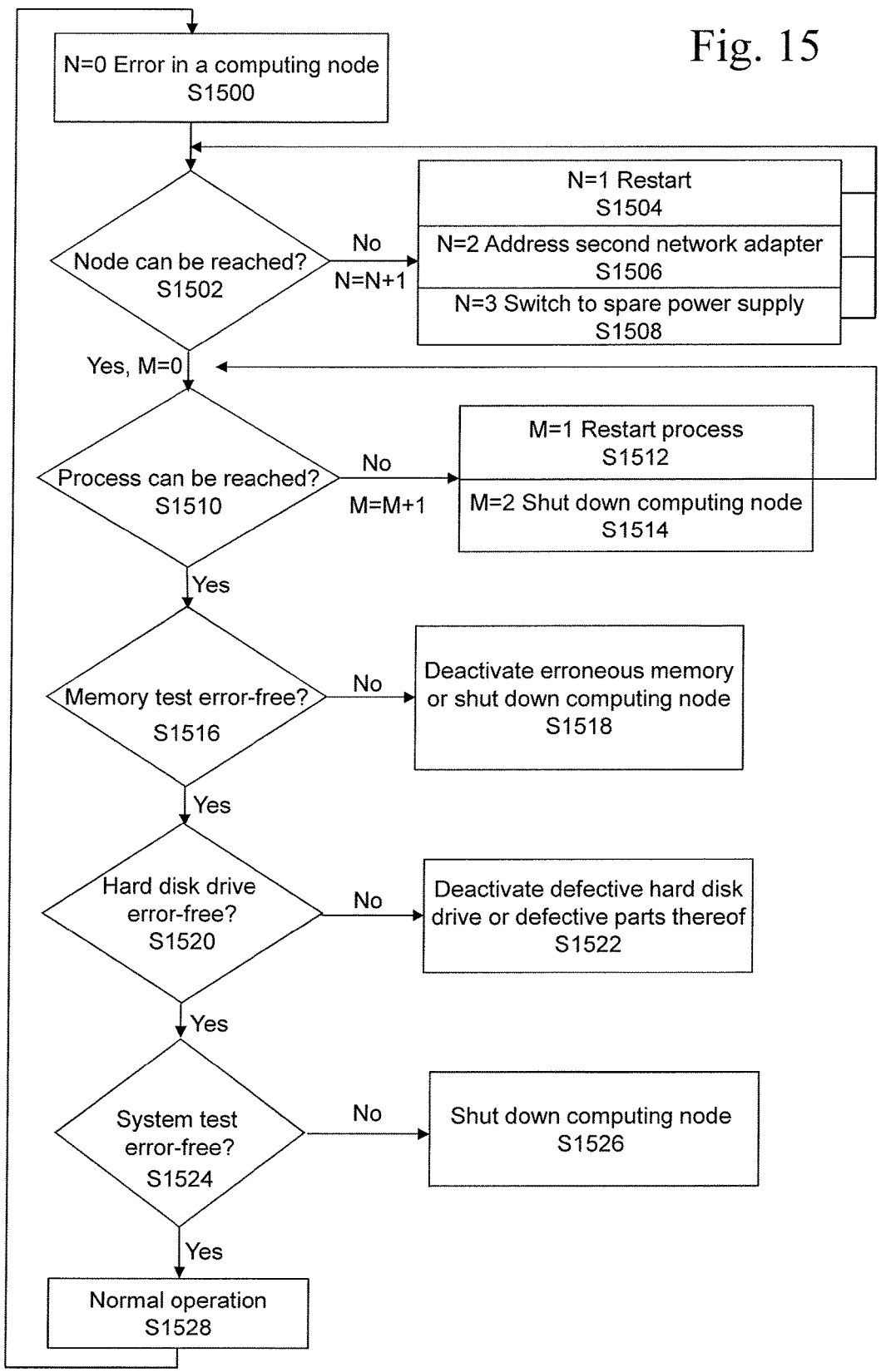
FIG. 15 shows a method for performing remote maintenance of the computer according to various embodiments.

In the case of a decentralized computing center, which is composed of a large number of computers which are connected together to form a computing grouping or a computer cloud, there is a need for special hardware modifications and error recovery routines. This makes it possible to ensure that the maintenance of the hardware is not made more difficult and the maintenance intervals can be kept short (for example once per year). Furthermore, the computers can be connected to an interruption-free power supply which copes with relatively short failures and permits controlled powering down of the system in the event of relatively long power failures. An embodiment of a method for performing a remote maintenance of the computer is illustrated to this effect in a flowchart diagram in FIG. 15. The starting point of the method is, in step S1500, the occurrence of a possibly permanent error in a computing node (N=0). This is expressed, for example, as a faulty transmission, or a failure of transmission, of calculation results, for example to the computing load distribution computer. Firstly it is checked whether the power supply and network connection are protected (not illustrated). In step S1502 it is subsequently checked whether the computing node can be reached. If the computing node cannot be reached (N=1), in step S1504 the computing node is restarted and it is checked again whether the computing node can be reached (step S1502). If the computing node continues to be impossible to reach (N=2), in step 1406 an attempt is made to reset a connection to the affected computing node via the second network adapter, and it is subsequently checked again whether the computing node can be reached (step S1502). If the computing node continues to be impossible to reach or address (N=3), the affected computing node is switched over to another network component and it is checked again whether the computing node can be reached (step S1502). If the computing node continues to be impossible to reach (N=4), it is switched off and is replaced or repaired at the next maintenance service. If the computing node can be reached after one of the steps S1504, S1506 or S1508 has been carried out and renewed checking (S1502) has occurred, in step S1510 it is checked whether the process or processes associated with the computing tasks can be achieved (M=0). If this is not the case (M=1) then the process is restarted and it is checked again whether the process can be achieved (S1510). If this is not the case (M=2), the affected node is switched off and is replaced or repaired at the next maintenance service. If the process can be achieved after one of the steps S1512 or S1514 has been carried out and renewed checking (S1510) has occurred, in step S1516 a main memory test of the affected computing node is executed. If a memory error is detected in the main memory, in step S1518 an attempt is made to deactivate the faulty memory area, insofar as it is technically possible to do so, or, under certain circumstances, the affected computing node has to be switched off. If the main memory test is concluded without errors, in step S1520, the nonvolatile storage media (for example hard disks) are checked. If errors occur during the checking of the nonvolatile storage media, in step S1522 an attempt is made to deactivate the faulty parts insofar as it is technically possible to do so. Alternatively, the affected storage medium can also be entirely deactivated and alternatively a storage medium with the same data stored redundantly thereon can be used. In such a case it may be necessary to copy this data onto a further storage medium in order to restore redundancy. If, on the other hand, the checking of the nonvolatile storage media (S1520) occurs without errors, in step S1524 a system test is carried out. If errors occur during the system test which cannot be eliminated by means of remote maintenance, in step S1526 measures for data recovery are initiated and the affected node is switched off and is repaired or exchanged at the next scheduled maintenance operation.

If, on the other hand, the system test (S1524) occurs without errors, the computing node can be switched to a normal operating mode in step S1528.

Figure 16:
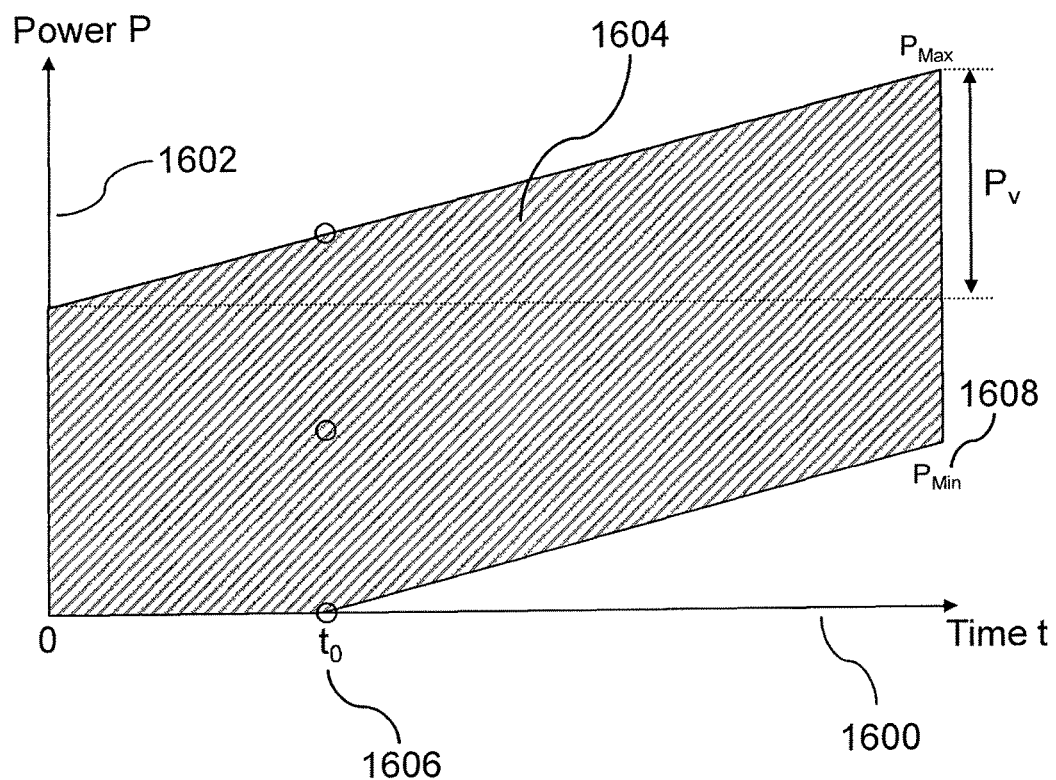
FIG. 16 shows an illustration of a power range for covering the heating demand in a building according to various embodiments.

FIG. 16 illustrates the relationship between a power range for covering the heating demand and the operation of the computer. A time is plotted on the x axis 1600 of the diagram, and a power level is plotted on the y axis 1602. The power range for covering the heating demand is dependent on the current and expected heating demand and is illustrated in the diagram by the hatched area 1604. Said power range may be dependent on a series of factors (for example external temperature). The profile illustrated in the diagram shows an instantaneous recording of the present power demand and is updated regularly on the basis of measured values and predictions. The computer can be operated firstly in the power range 0 to $P_{Max}$. Up to the time $t_0$ 1606 it is possible to leave the computer switched off. The computer is to be operated at the latest starting from the time $t_0$ 1606. The power can vary in the hatched area, as long as it does not drop below the value $P_{Min}$ 1608.

Figure 17:
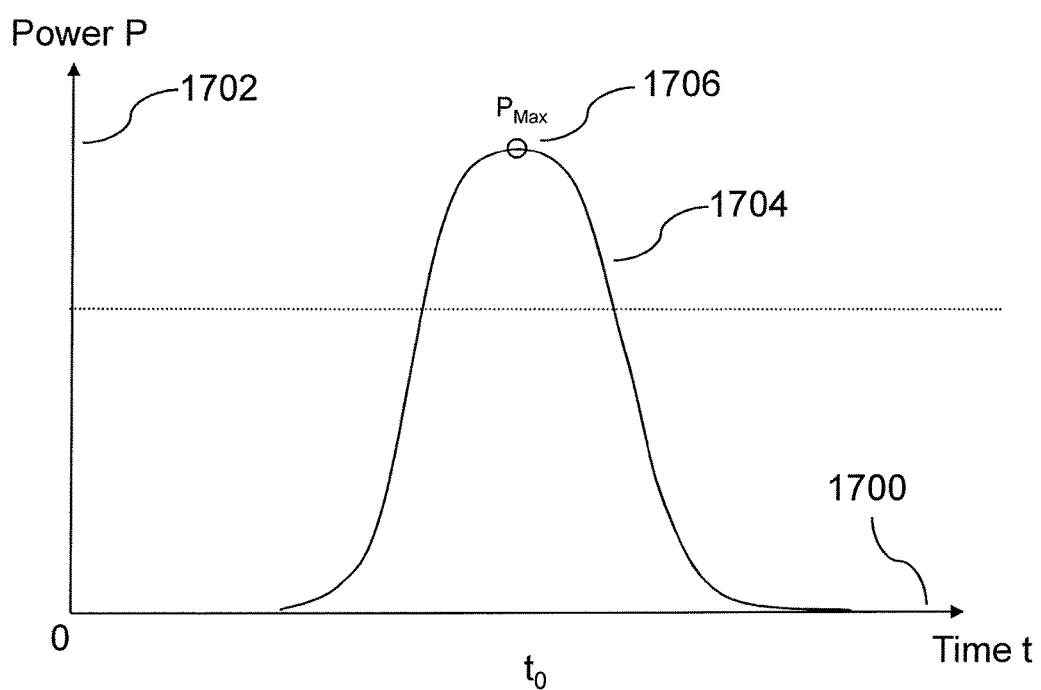
FIG. 17 shows an exemplary daily profile of the solar power.

In addition to the computer as a heat source, it is also possible to connect further heat sources to the heating system of the building. For example, a solar system can be connected to the heating system. A solar system is understood here to be a device which converts solar energy into electrical energy (photovoltaic) or into thermal energy. In order to implement efficient coupling of the solar system and of the computer to the heating system, the availability of solar energy, which fluctuates over the course of a day, is taken into account in the estimation of the waste heat to be supplied by the computer. FIG. 17 illustrates an exemplary daily profile of the power of the sun (cloudless sunny day). The time is plotted on the x axis 1700, wherein the area which can be seen in the diagram is intended to cover a daily profile of 24 hours, and the solar power is plotted on the y axis 1702. The profile of the solar power 1704 has a bell-shape, wherein said profile reaches its maximum value 1706 ($P_{max}$) at midday ($t_0$).

Figure 18:
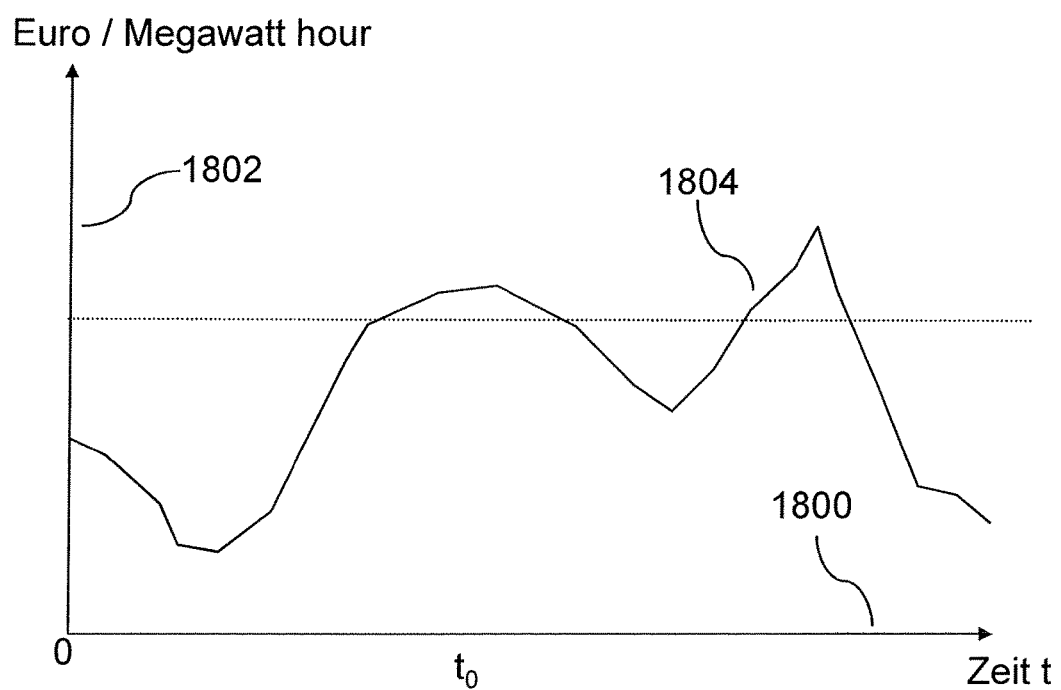
FIG. 18 shows an exemplary profile of the change in the price paid for electricity.

As already stated, the price of electricity is one of the possible factors which is taken into account in the distribution of the computing tasks to the computer by the computing load distribution computer. FIG. 18 illustrates an exemplary profile of the price of electricity at the Frankfurt stock Market EEX. The x axis 1800 of the graph represents the time, and the y axis 1802 represents the price in Euros per energy unit in megawatt hours. From this exemplary price profile 1804 it is apparent that the price of electricity is significantly lower in the early hours of the morning. It reaches its first maximum towards midday (approximately 12 o'clock) and has a further high point towards 20 hours in the evening. With the introduction of new generations of smart meters (obligatory in new buildings from 2010), it is possible to register electricity consumption and charge for it in a time-dependent fashion. This makes it possible, for example, to operate the computer at times of low electricity prices and to buffer the waste heat thereof in the heat accumulator, with the result that at times of high electricity prices less computing power is required to cover the heating demand of the heating system and/or of the building.

A short summary of the initial problems and the approach to the solution, which ultimately leads to the heating system according to various embodiments, is given below.

At present, German computing centers already produce in one year enough waste heat to be able to heat all new buildings throughout the country for twelve years (as at 2011). It is expected that, on the one hand, the energy consumption of computer centers will continue to grow strongly despite the increasing use of energy-efficient computers. On the other hand, the energy consumption of new buildings will continue to drop sharply, driven by new legislation. It is therefore expected that in future a large proportion of new buildings and also modernized housing could in principle be covered by the waste heat of computing centers.

The invention is based on the thermal coupling of a computer, also referred to as computer heating or IT cloud heater, to one or more heat distributing devices for heating buildings, for example residential buildings and/or office buildings and/or commercial and/or public facilities. This coupling makes use of the cooling necessary for operating the computer, in order to cover the entire heating demand and, if appropriate, the entire demand for hot water of a building and/or a residential unit.

As already mentioned, there are already approaches and implementations of "green computing" in which the waste heat of computing centers is utilized for the partial temperature control of nearby buildings. These approaches are still in the early stages of development. An example of this is the IBM hot water super computer at the ETH Zurich, in which the waste heat of the servers is fed to the heating circuit via a water-based cooling circuit. This computing center therefore acts in a way which assists the heating. The servers are operated there in a "classic" fashion, twenty four hours a day, i.e. there is no heat-controlled modulation of the computers. In contrast to this, the majority of computing centers produce significantly more waste heat than can be used locally. The waste heat in computing centers is to a significant extent not able to be used for other purposes owing to the low temperature level, and therefore it has to be transported away by means of costly cooling technology and at additional cost in terms of energy.

Heating systems in houses convert primary energy carriers (usually fossil fuels) and secondary energy carriers (electricity) into heat. There is generally no higher order use of the energy carrier in the form of computing power.

The problem of utilizing the waste heat of computing centers is the transportation of the waste heat from the computing centers to the buildings. It would be necessary to build a long distance heating network with high associated costs and said network could never cover a large area. The heating systems described here constitute a selection of a reciprocal approach in which the computing tasks are distributed among buildings so that the heat is produced there where it is consumed. Furthermore, in the course of this approach it is also possible to consume regenerative energy, for example solar current, at the location where it is produced. This distribution of computing tasks is also made possible by the increasing use of cloud computing and the ongoing construction of high speed networks. The objective pursued here is to distribute computers of computing centers among low energy buildings and to completely replace conventional heating with the waste heat which is produced in any case. In order to be able to cover the heating demand of a passive house with 160 $m^2$ heated area only eight computing units each with a 200 watt rating (as at 2011) would be necessary, for example.

Cloud computing is primarily the approach of making available abstract IT infrastructure (for example computing capacity, data memory, readymade software environments and programming environments) as a service in a way which is dynamically adapted to the demand, via a network. The billing is carried out here as a function of the use since only services which are actually used have to be paid for. A further central point of the concept is that provision can be effected in a fully automatic fashion on the basis of the combination of virtualized computing centers and modern web technologies, such as web services, and therefore no need for any man/machine interaction anymore at all.

In order to combine the computers in terms of their functions again to form a computing center, they are joined together to form one or more large distributed cloud computing centers. The calculations on a computer are modulated in accordance with the heating demand of a house. The computing units themselves occur in buildings in the place of the classic heating system and, for example in technical spaces, are installed precisely at the location at which otherwise a heating system would be located. The space required and the investment costs of the individual decentralized (i.e. geographically distributed) systems is comparable or below that of a modern heat pump heating system.

According to various embodiments, the possibility is provided of modulating the computing power of the computers in such a way that they are operated in a heat-controlled fashion. If a high heating load is required, all the computers are subjected to maximum computing load. Furthermore, the computing power and the heating power can be modulated according to economic and ecological criteria. These may be, for example, modulation of the computing power as a function of the availability of regenerative sources (solar force, wind force) and/or as a function of the current electricity prices.

Further advantages are a cost reduction in the building heating sector, a cost reduction for the operation of computing centers and the avoidance of the atmospheric gas $CO_2$.

Many advantages are obtained for the operator of a computing center when using the concept proposed here. The heating system makes it possible to save over 50% of the costs of a classic computing center. The overall costs are composed of, on the one hand, of the writing down of the investment, interest and operational business of the computers, and on the other hand of costs for the infrastructure and cooling (building and computer).

Since the heating system network pursues the approach of operating the computers where heat is consumed and the accommodation is already available, the costs of the infrastructure and cooling can therefore be completely eliminated. This cost factor makes up 60% of all the expenditure of a modern computing center. These costs can, for the most part, be eliminated. By taking into account the slightly increased administrative costs for the decentralized heating system infrastructure it is possible, with the underlying business model, to assume that a real cost saving of 51% can be achieved, which saving can, depending on the business model, be passed on to computing center operators and/or owners of buildings.

The heating system also provides advantages for the owner of the building. With the heating system, the owner of the building is provided with a cost-saving heating system which covers the heating requirements of his building and optionally ensures all the preparation of hot water. This provides, for example, the advantage of reducing or eliminating the yearly operating costs. Depending on the cost model, in one possible model the owner of the building could be relieved of all operational and/or maintenance costs for his heating system for a period of ten years. These costs could be assumed by the operator of the cloud environment. A further advantage is that, depending on the business model, investment costs are equivalent to or less than in the case of a heat pump heating system. According to various embodiments, the heating system requires the same mounting area or less mounting area than for a heating pump. Yet another advantage is that regular maintenance and chimney cleaning costs are eliminated. A classic heating system for new low-energy buildings is frequently over-dimensioned, and when fossil fuels are burnt such a heating system incurs regular maintenance costs and chimney cleaning costs which would not occur when the heating system described here is used. Since it is also possible to dispense with the chimney, the investment associated therewith is also eliminated. Yet another advantage is the fact that solar-produced current can be used as according to its availability. The heating system provides the possibility of using regenerative energy sources locally and as a function of production and of buffering excess capacity. If the fluctuating price of electricity is taken into account in future energy provision cost systems and consumption models (by means of "smart meters" for example, that is to say intelligent power meters), the heating system can make use of these both with respect to the electricity which is obtained and the feeding in of solar-produced current, and can provide a financial saving for the owner of the building.

There are also many advantages for the environment when the various embodiments of the heating system are used. When the heating system proposed here is used, in Germany alone up to 1.65 million tons of $CO_2$ per year would not enter the environment, which would contribute to a considerable reduction in the $CO_2$ emissions. This saving results, on the one hand, through the elimination of the energy consumed for cooling the computers and, on the other hand, as a result of the "recycling" of the waste heat to heat buildings. For comparison, in 2005 the $CO_2$ emissions created as a result of national air transportation was 1.3 million tons. However, the savings mentioned above assume that all the computing centers would be replaced by the heating system or systems or heating system networks presented here. In a conservative scenario, according to which in the medium term 10% of all computing centers in Germany will be replaced by the heating systems described in this application, a quantity of energy of 1.01 billion kilowatt hours would be available for space heating (as at 2011). This corresponds to the quantity of energy which is necessary to heat the space of all the new buildings constructed in Germany. For the environment there is also a further advantage in that the building of new computing centers owing to increased demand becomes superfluous. This provides a saving in terms of resources, energy and space requirements, savings which would be incurred whenever a new computing center is constructed. This consideration is based on the assumption that it would be possible to implement heating system networks with the broadband network which is already available or will be available shortly.

What is claimed is:

1. A heating system for heating a building and/or for preparing hot water, comprising:
   a heat distributing device; and
   a computer which is coupled to the heat distributing device,
   a control device coupled to the computer, wherein the control device is configured to operate autonomously and to produce and transmit a message for a computing load distribution computer, the message comprising information about a heat increase demand to increase a temperature of the heating system and/or of the building,
   wherein the computer is configured to be switched on by powering said computer up and switched off by powering said computer down as a function of a computing load of the computer.

2. The heating system as claimed in claim 1,
   wherein the computer is configured in such a way that the computer is switched respectively on and off in reaction to the reception of a switch-on/switch-off message which is received by the control device from the computing load distribution computer in response to the heat increase demand.

3. The heating system as claimed in claim 1,
   wherein the control device is coupled to a public network for transmitting the message to the computing load distribution computer.

4. The heating system as claimed in claim 1,
   wherein the control device is configured to acquire at least one parameter which is necessary to operate the heating system.

5. The heating system as claimed in claim 1,
   wherein the control device has a receiver configured to receive one or more messages from the computing load distribution computer, wherein an execution of calculations is requested in one or more of the messages, and
   wherein the computer is configured in such a way that it carries out the calculations requested by means of the one or more received messages.

6. The heating system as claimed in claim 1,
   wherein the heating distribution device has a pipe or a plurality of pipes which is or are filled with a fluid by means of which heat produced by the computer is distributed,
   wherein this is done by direct connection to the heat distributing device, or by coupling the computer to the heat distributing device by means of a heat exchanger.

7. The heating system as claimed in claim 1, further comprising:
   an air supply device, which is coupled to the computer by means of the heat exchanger in such a way that supplied air is used for cooling the computer.

8. The heating system as claimed in claim 7,
   wherein the heating distribution device has a pipe or a plurality of pipes which is or are filled with a fluid by means of which heat produced by the computer is distributed,
   wherein this is done by direct connection to the heat distributing device, or by coupling the computer to the heat distributing device by means of a heat exchanger,
   wherein the air supply device also has a bypass which makes available a coupling to the computer by bypassing the heat exchanger.

9. The heating system as claimed in claim 1,
   wherein the control device is further configured to carry out technical control functions in a power network and data network of the building.

10. The heating system as claimed in claim 1,
    wherein the control device is further configured to carry out control processes for acquiring at least one parameter for operating the heating system to increase temperature of the heating system.

11. The heating system as claimed in claim 10,
    wherein the at least one parameter is from the following group of parameters, the group consisting of:
    a quantity of heat to increase temperature of the building,
    a temperature of the building, and
    an air humidity level of the building.

12. The heating system as claimed in claim 1,
wherein the control device is further coupled to at least one sensor.

13. The heating system as claimed in claim 12,
wherein the at least one sensor is from the following group of sensors, the group consisting of:
an air humidity sensor,
a light sensor,
a wind sensor,
a carbon dioxide sensor,
a fire alarm sensor, and
a water consumption sensor.

14. A computer of a heating system for heating a building and/or for preparing hot water,
wherein the computer is configured to be switched on by powering said computer up and switched off by powering said computer down as a function of a computing load of the computer; and
a transmitter provided as a separate module coupled to the computer and configured to produce a message for a computing load distribution computer, wherein the message contains information about a heat increase demand of the heating system and/or of the building and/or of the water and further configured to transmit the message to the computing load distribution computer; and
a receiver provided as a separate module coupled to the computer and configured to receive one or more messages from the computing load distribution computer that requests execution of calculations.

15. The computer as claimed in claim 14,
wherein the computer is configured to be switched respectively on and off in reaction to the reception of a switch-on/switch-off message which is received by the receiver from the computing load distribution computer.

16. The computer as claimed in claim 14,
wherein the computer is connected to a heat distributing device of the building via a further connection for discharging cooling air.

17. The computer as claimed in claim 14,
wherein the computer is the only heating element coupled to the heating distributing device of the building.

18. A method for operating a heating system for heating a building and/or for preparing hot water, wherein the method comprises:
determining a heat demand of the heating system and/or of the building and/or of the water;
producing a message for a computing load distribution computer with information about the heat demand of the heating system and/or of the building by means of a control device coupled to a computer, wherein the message comprises information about a heat demand to increase a temperature of the heating system or the building; and
switching the computer on by powering the computer up and switching the computer off by powering the computer down as a function of a computing load of the computer in reaction to the reception of a switch-on/switch-off message received by a computing load distribution computer.

* * * * *